United States Patent
Choi et al.

(10) Patent No.: US 8,278,123 B2
(45) Date of Patent: Oct. 2, 2012

(54) FERROMAGNETIC PREFERRED GRAIN GROWTH PROMOTION SEED LAYER FOR AMORPHOUS OR MICROCRYSTALLINE MGO TUNNEL BARRIER

(75) Inventors: Young-suk Choi, Santa Clara, CA (US); Yuichi Otani, Kawasaki (JP)

(73) Assignee: Canon Anelva Corporation, Kawaski-shi (JP)

( * ) Notice: Subject to any disclaimer, the term of this patent is extended or adjusted under 35 U.S.C. 154(b) by 0 days.

(21) Appl. No.: 13/037,796

(22) Filed: Mar. 1, 2011

(65) Prior Publication Data

US 2011/0318848 A1    Dec. 29, 2011

Related U.S. Application Data

(63) Continuation of application No. PCT/JP2009/058948, filed on May 1, 2009.

(30) Foreign Application Priority Data

Sep. 3, 2008  (WO) .................. PCT/JP2008/066474

(51) Int. Cl.
  *H01L 21/00* (2006.01)
(52) U.S. Cl. .................................... 438/3; 257/E21.665
(58) Field of Classification Search ...................... 438/3; 257/E21.665
  See application file for complete search history.

(56) References Cited

U.S. PATENT DOCUMENTS

| | | | |
|---|---|---|---|
| 6,849,464 B2 * | 2/2005 | Drewes .............................. | 438/3 |
| 7,098,495 B2 | 8/2006 | Sun et al. ...................... | 257/295 |
| 7,270,896 B2 | 9/2007 | Parkin | |
| 7,682,841 B2 * | 3/2010 | Dahmani et al. .................. | 438/3 |
| 8,139,325 B2 | 3/2012 | Tsunekawa et al. | |
| 2006/0017081 A1 * | 1/2006 | Sun et al. ...................... | 257/295 |
| 2006/0056115 A1 | 3/2006 | Djayaprawira et al. | |
| 2006/0176735 A1 | 8/2006 | Yuasa ............................ | 365/173 |
| 2007/0096229 A1 * | 5/2007 | Yoshikawa et al. ........... | 257/421 |
| 2007/0111332 A1 * | 5/2007 | Zhao et al. ........................ | 438/3 |
| 2008/0074805 A1 | 3/2008 | Ikarashi et al. ............. | 360/324.2 |
| 2008/0124581 A1 | 5/2008 | Miura et al. ............... | 428/811.1 |

(Continued)

FOREIGN PATENT DOCUMENTS

EP       2159858 A1       3/2010
(Continued)

OTHER PUBLICATIONS

Butler et al., "Spin-dependent tunneling conductance of Fe | MgO | Fe sandwiches", Physical Review B., vol. 63, pp. 054416-1 to 054416-12 (2001).

(Continued)

*Primary Examiner* — Julio J Maldonado
*Assistant Examiner* — Robert Bachner
(74) *Attorney, Agent, or Firm* — Fitzpatrick, Cella, Harper & Scinto

(57) ABSTRACT

MgO-based magnetic tunnel junction (MTJ) device includes in essence a ferromagnetic reference layer, a MgO tunnel barrier and a ferromagnetic free layer. The microstructure of MgO tunnel barrier, which is prepared by the metallic Mg deposition followed by the oxidation process or reactive sputtering, is amorphous or microcrystalline with poor (001) out-of-plane texture. In the present invention at least only the ferromagnetic reference layer or both of the ferromagnetic reference and free layer is proposed to be bi-layer structure having a crystalline preferred grain growth promotion (PGGP) seed layer adjacent to the tunnel barrier. This crystalline PGGP seed layer induces the crystallization and the preferred grain growth of the MgO tunnel barrier upon post-deposition annealing.

6 Claims, 27 Drawing Sheets

U.S. PATENT DOCUMENTS

| | | | |
|---|---|---|---|
| 2008/0160326 A1 | 7/2008 | Nishimura et al. | 428/457 |
| 2008/0174921 A1 | 7/2008 | Ikarashi et al. | 360/320 |
| 2008/0179699 A1* | 7/2008 | Horng et al. | 257/421 |
| 2008/0182342 A1* | 7/2008 | Parkin | 438/3 |

FOREIGN PATENT DOCUMENTS

| | | | |
|---|---|---|---|
| JP | 2005-085821 A | | 3/2005 |
| JP | 2005085821 | * | 3/2005 |
| JP | 2006-210391 A | | 8/2006 |
| JP | 2007-150265 A | | 6/2007 |
| JP | 2007-165786 A | | 6/2007 |
| JP | 2008-507854 T | | 3/2008 |
| JP | 2008-091484 A | | 4/2008 |
| JP | 2008-103661 A | | 5/2008 |
| JP | 2008-135432 A | | 6/2008 |
| JP | 2008-166533 A | | 7/2008 |

OTHER PUBLICATIONS

Yuasa et al., "Giant tunneling magnetoresistance in fully epitaxial body-centered-cubic Co/MgO/Fe magnetic tunnel junctions", Applied Physics Letters, vol. 87, pp. 222508-1 to 222508-3 (2005).

Parkin et al., "Giant tunneling magnetoresistance at room temperature with MgO (100) tunnel barriers", Nature Materials, vol. 3, pp. 862-867 (2004).

Djayaprawira et al., "230% room-temperature magnetoresistance in CoFeB/MgO/CoFeB magnetic tunnel junctions", Applied Physic Letters, vol. 86, pp. 092502-1 to 092502-3 (2005).

Choi et al., "Effect of Ta getter on the quality of MgO tunnel barrier in the polycrystalline CoFeB/MgO/CoFeB magnetic tunnel junction", Applied Physic Letters, vol. 90, pp. 012505-1 to 012505-3 (2007).

Choi et al., "Transmission electron microscopy study on the polycrystalline CoFeB/MgO/CoFeB based magnetic tunnel junction showing a high tunneling magnetoresistance, predicted in single crystal magnetic tunnel junction", Journal of Applied Physics, vol. 101, pp. 013907-1 to 013907-4 (2007).

Park et al., "A study on tunneling magnetoresistance in magnetic tunnel junctions oxidized by ozone", Journal of Magnetism and Magnetic Materials, pp. 926-929 (2001).

Oh et al., "Magnetic and Electrical Properties of Magnetic Tunnel Junctions With Radical Oxidized MgO Barriers", IEEE Transactions of Magnetics, vol. 42, No. 10, pp. 2642-2644 (2006).

Tehrani et al., "Magnetoresistive Random Access Memory Using Magnetic Tunnel Junctions", Proceedings of the IEEE, vol. 91, No. 5, pp. 703-714 (2003).

PCT International Search Report and Written Opinion of the International Searching Authority issued in International Application No. PCT/JP2009/058948—12 pages.

Great Britain Office Action issued in GB1103639.9 (issued on Jun. 28, 2012) (3 pages).

* cited by examiner

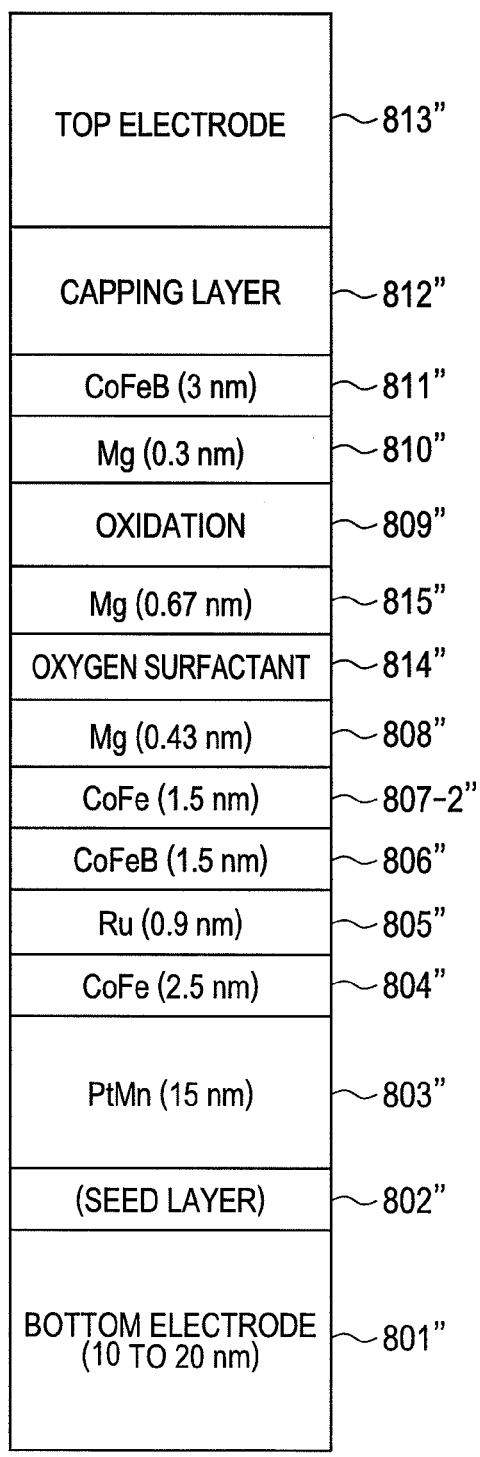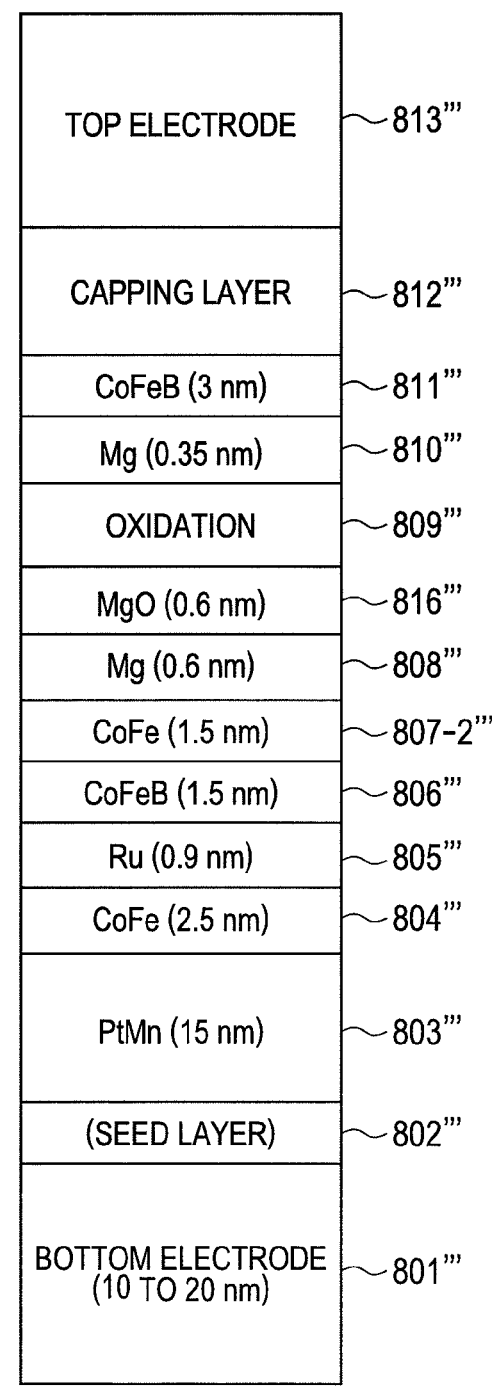
FIG. 8C
FIG. 8D

| Boron content | 2 theta | FWHM* | Resistivity (μO-cm) |
|---|---|---|---|
| 2.9 at.% | 45.35 | 0.593 | 20.59 |
| 5.1 at.% | 45.02 | 0.820 | 43.16 |
| 20 at.% | No peak | N/A | 111.47 |

*FWHM : Full Width at Half Maximum

FERROMAGNETIC PREFERRED GRAIN GROWTH PROMOTION SEED LAYER FOR AMORPHOUS OR MICROCRYSTALLINE MGO TUNNEL BARRIER

BACKGROUND ART

1. Field of the Invention

The present invention is related to the field of magnetic tunnel junction (MTJ) devices with particular reference to the magnetic random access memory (MRAM) and the magnetic sensors including the recording read head in hard disk drive and so on, which employ tunneling magnetoresistance. More particularly, this invention relates to the MTJ devices with MgO tunnel barrier prepared by oxidation methods or reactive sputtering method, microstructure of which is amorphous or microcrystalline with poor (001) out-of-plane texture. More particularly, this invention relates to the MTJ devices with the insertion of the crystalline ferromagnetic layers, which is the PGGP seed layers, adjacent to the MgO tunnel barrier in order to enhance the crystallinity of the MgO tunnel barrier during post-deposition annealing.

2. Related Arts

Core element in the magnetic tunnel junction (MTJ) device is "ferromagnetic layer/tunnel barrier/ferromagnetic layer" tri-layer structure. The change of resistance of the MTJ device is attributed to the difference in the tunneling probability of the spin polarized electrons through the tunnel barrier on the bias voltage across the device in accordance with the relative orientation of magnetizations of the two ferromagnetic layers.

The relative orientation of the magnetizations of the two ferromagnetic layers sandwiching the tunnel barrier is realized by the different nature of the magnetization reversal of the two ferromagnetic layers, in that the magnetization of one ferromagnetic layer is not reversed by the external magnetic field in operation, whereas that of the other ferromagnetic layer responds to the external magnetic field. Thus parallel or antiparallel alignment of the magnetizations of the two ferromagnetic layers sandwiching the tunnel barrier in device operation is realized.

Tunnel barrier is commonly a dielectric material and must be ultra thin and extremely uniform in thickness as well as composition. Any inconsistency in terms of chemical stoichiometry or thickness degrades the device performance significantly.

Most typically employed structure of MTJ device is schematically illustrated in FIG. 1, which consists of an antiferromagnetic pinning layer 103, a synthetic antiferromagnetic (SAF) pinned layer 110, a tunnel barrier 107 and a ferromagnetic free layer 108. The synthetic antiferromagnetic (SAF) pinned layer includes a ferromagnetic pinned layer 104, a non-magnetic spacer 105 and a ferromagnetic reference layer 106.

Ever since its discovery, high TMR at room temperature has been one of hot topics of industries due to its spintronics application, such as non-volatile magnetoresistive random access memory (MRAM) and magnetic sensors such as the recording read-head in hard disk drive. For conventional field switching MRAM application, 1 Mbit MRAM with the bit size of 300×600 $nm^2$ requires the MTJ to provide the magnetoresistance (MR) ratio of 40% at the resistance-area (R×A) product of about 1 k-2 k $\Omega\mu m^2$. At the higher density of 250 Mbits, the bit size scales down to 200×400 $nm^2$ and requires MR ratio of higher than 40% at the R×A product of about 0.5 k $\Omega\mu m^2$. Further scaling can be achieved in MRAM by application of magnetization reversal by the spin transfer torque, however, it is required for the MTJ to provide MR ratio higher than 150% at the R×A product range of 10-30 $\Omega\mu m^2$. For the recording read-head in hard disk drive, it is required for the MTJ to provide MR ratio higher than 50% at the R×A product range of 1-2 $\Omega\mu m^2$ in order to pick up reliable signals from the media with areal density of 250 Gbit/$in^2$.

Early efforts made on amorphous $AlO_x$ tunnel barrier and ferromagnetic electrodes with high spin polarization were not satisfactory for the requirements mentioned above. Recently single crystal Fe/MgO/Fe has been suggested by theoretical calculation, (Butler et al., Phys. Rev. B 63, (2001) p 054416) and it is predicted that as high as 6000% room temperature-TMR can be obtained due to a superior spin filtering effect of MgO. This spin filtering effect, that is a total reflection of minority spin down electrons in antiparallel magnetization alignment of the two ferromagnetic layers sandwiching MgO tunnel barrier of MTJ, is inherent from the absence of Bloch eigenstates in minority spin-down spin channel with Δ1 symmetry at the Fermi surface. This allows a coherent tunneling, and furthermore enables a giant TMR ratio. There is a microstructural requirement to allow this coherent tunneling, which is the epitaxial growth of Fe (001)/MgO (001)/Fe (001), in that the tunneling electron passes through the (001) atomic planes of Fe and MgO. Experimental attempts to achieve this giant TMR based on single crystal (Fe/MgO/CoFe) growth using molecular beam epitaxy demonstrated room temperature TMR up to 180%. (Yuasa et al. Appl. Phys. Lett. 87 (2005) p 222508) Using MgO tunnel barrier with polycrystalline CoFe ferromagnetic electrodes, 220% room temperature TMR was reported, (Parkin et al. Nat. Mater. 3 (2004) p 862) and even higher TMR reported in MTJ prepared by practical magnetron sputtering on thermally oxidized Si wafer using amorphous CoFeB ferromagnetic electrodes. (Djayaprawira et al. Appl. Phys. Lett. 86 (2005) p 092502)

Great deal of efforts have been made to form the MgO tunnel barrier in the MTJ, which is ultra thin and extremely uniform in thickness as well as composition. Furthermore, similar amount of efforts have been exerted to achieve the crystallinity of MgO tunnel barrier with (001) out-of-plane texture in order to satisfy the microstructural requirement, (001) out-of-plane epitaxy together with bcc-structured sandwiching ferromagnetic layers, given by the theoretical calculation and confirmed by microstructural and thin film chemistry studies. (Y. S. Choi et al. Appl. Phys. Lett. 90 (2007) p 012505, Y. S. Choi et al. J. Appl. Phys. 101 (2007) p 013907)

In general method of preparing MTJ devices for the mass production of MRAM or recording read-head, the deposition of MgO tunnel barrier is divided into the direct deposition and the metal deposition followed by oxidation process. Deposition of tunnel barrier using ceramic target by rf-sputtering or reactive sputtering of metal target in the ambience of gas mixture of oxygen and inert gas falls into the first group of direct deposition. Metal deposition followed by various kinds of oxidation processes, such as natural oxidation, plasma oxidation, radical oxidation or ozone oxidation, falls into the second group.

One of critical bottlenecks for MTJ development is the uniform thickness control of tunnel barrier at the extremely thin thickness. If the thickness of the tunnel barrier is too thin, it is highly possible to contain pinholes, where leak current passes through without spin-dependent tunneling. This degrades signal to noise ratio (S/N) significantly. Another bottleneck is chemical inhomogeneity of tunnel barrier, result in over- or under-oxidation, and the oxidation of underlying ferromagnetic layer. These lead to asymmetric electrical properties with respect to signs of applied bias and abnormal increase of R×A product and decrease of TMR ratio due to the additional tunnel barrier thickness with spin scattering in the surface-oxidized underlying ferromagnetic layer. (Park et al. J. Magn. Magn. Mat., 226-230 (2001) p 926)

Besides the issues of the uniform thickness control of ultra-thin MgO tunnel barrier and the chemical homogeneity across the MgO tunnel barrier, most imminent issue to achieve the giant TMR ratio with low R×A product of MgO-based MTJ is the (001) out-of-plane texture of the ferromagnetic reference layer, MgO tunnel barrier and the ferromagnetic free layer, and the high crystallinity of MgO tunnel barrier. FIG. 2 shows the relationship of MgO texture and crystallinity and the magnetotransport property in CoFeB/MgO/CoFeB MTJ, where MgO is deposited by rf sputtering. It is clearly shown in the FIG. 2A and FIG. 2B that the MTJ prepared with highly crystalline and (001) textured MgO tunnel barrier induces the corresponding (001) texture of CoFe through crystallization of CoFeB amorphous layers by annealing, thus overall (001) texture of CoFeB/MgO/CoFeB is realized. Therefore, it is possible to obtain significantly enhanced MR ratio at low R×A product, as shown in FIG. 2C. However, MTJ with MgO tunnel barrier with poor crystallinity shows very low MR ratio with extremely high R×A product, as also seen in FIG. 2C.

Despite MgO tunnel barrier prepared by rf sputtering has shown great advances by process optimization, there are serious issues, which are hard to overcome for the mass-production, in that MR ratio and R×A product change very sensitively depending on the chamber condition and particle generation inherent from rf-sputtering. (Oh et al. IEEE Trans. Magn., 42 (2006) p 2642) Furthermore, it has been reported that the final R×A product uniformity (1σ) of MTJ devices with MgO tunnel barrier prepared by rf-sputtering is more than 10%, whereas that of MgO tunnel barrier prepared by Mg deposition followed by oxidation process is less than 3%. (Zhao et al. US Patent Application, US 2007/0111332)

Alternative methods of MgO tunnel barrier preparation are the metallic Mg deposition followed by the various oxidation processes or reactive Mg sputtering in the ambience of gas mixture of oxygen and inert gas. Plasma oxidation has been employed in the preparation for AlOx tunnel barrier, however, its high reactivity makes it exceptionally difficult to oxidize ultra-thin metal layer, especially very fast oxidation rate of Mg for MgO formation, precisely down to the interface with the underlying ferromagnetic layer. Thus R×A product and MR ratio of 10000 Ωμm²/45% are obtained by plasma oxidation process, (Tehrani et al. IEEE Trans. Magn., 91 (2003) p 703) whereas those of 1000 Ωμm²/30% by ozone oxidation from MTJ with AlOx tunnel barrier. (Park et al. J. Magn. Magn. Mat., 226-230 (2001) p 926)

Therefore, less energetic oxidation processes have been suggested, which are radical oxidation and natural oxidation to form MgO tunnel barrier. Also reactive sputtering of Mg metal target to form MgO tunnel barrier in the ambience of Ar and $O_2$. FIG. 3 shows the magnetotransport property measurement results obtained from MTJs with MgO tunnel barrier prepared by various methods of MgO tunnel barrier deposition. The MTJ structure is identical except the MgO tunnel barrier part, which is bottom layers/PtMn (15)/CoFe (2.5)/Ru (0.9)/CoFeB (3)/MgO (x)/CoFeB (3)/capping layer. Thickness in parenthesis is in nanometer scale. With reference to the MR ratio and R×A product obtained from the MTJ with MgO prepared by rf sputtering, it is clearly shown that the MR ratio of the MTJ with MgO tunnel barrier prepared by oxidation methods and reactive sputtering is significantly lower. At given R×A product of 10 Ωμm², MTJ with MgO prepared by rf sputtering provides MR ratio of 180%, whereas MgO deposited by radical oxidation method provides 100%, natural oxidation provides 60%, and MgO prepared by reactive sputtering provides 135%.

The microstructure analyses were carried out with high-resolution transmission microscopy (HREM) and x-ray diffraction (XRD) and x-ray photoelectron spectroscopy (XPS). As shown in FIG. 4A and FIG. 4B, it is clearly compared that the difference in the magnetotransport property results from the difference in the crystallinity of MgO tunnel barrier and the lack of epitaxy in CoFeB/MgO/CoFeB layers. FIG. 4A and FIG. 4B are cross-section HREM images taken from the MTJs with MgO tunnel barrier prepared by rf-sputtering and radical oxidation, respectively. As reported by Choi et al. in J. Appl. Phys. 101 (2007) p 013907, CoFeB/MgO/CoFeB-based MTJ prepared by rf sputtering satisfies the microstructural requirement given by the theoretical calculations by Butler et al., in that MgO is highly crystalline and in good grain-to-grain epitaxy with CoFe layers. The CoFe layers are crystallized by post-deposition annealing based on the crystalline MgO as a crystallization template, thus the grain-to-grain epitaxy is realized in CoFe/MgO/CoFe layers. However, MgO tunnel barrier prepared by radical oxidation shows the poor crystallinity mixed with amorphous and it is hard to confirm the pseudo-epitaxy at the interface with CoFe layers.

FIG. 4C shows the clear comparison of the MgO crystallinity and texture with respect to its deposition method, rf-sputtering and natural oxidation. Out-of-plane theta-2 theta scan confirms that MgO tunnel barrier deposited on the amorphous CoFeB layer by rf-sputtering is highly crystalline in as-grown state and highly textured with (001) out-of-plane preferred orientation by pronounced MgO (002) peak at 2 theta=42.4°. However, MgO prepared by metal deposition followed by natural oxidation shows no pronounced peak, which indicates that the MgO layer is almost amorphous.

FIG. 4D and FIG. 4E are XPS spectra obtained from the MTJs with MgO tunnel barrier prepared by rf-sputtering and reactive sputtering, respectively. As reported by Choi et al. in Appl. Phys. Lett. 90 (2007) p 012505, it is critical to have the dominant population of oxygen ions in the lattice point of NaCl-structured MgO for the crystallinity of MgO and higher MR ratio of the MTJ and lower R×A product. It is clear, as shown in FIG. 4D, that the population of oxygen ions (whose binding energy is around 531 eV) occupying lattice point of NaCl-structured MgO is very high in the MgO deposited by rf sputtering, however, there is considerable population of impurity oxygen ion (whose binding energy is around 533.3 eV), as shown in FIG. 4B, which is almost a third of that of oxygen ion in the lattice point in the MgO deposited by reactive sputtering. Thus it can be inferred that this high density of impurity oxygen ions in the MgO barrier is related to the poor crystallinity of MgO and is responsible for the poor MR ratio.

In order to achieve good crystallinity of MgO tunnel barrier prepared by oxidation method, crystalline ferromagnetic reference layer, not bi-layer but single layer, has been employed, in that the structure of MTJ is bottom layers/PtMn (15)/CoFe (2.5)/Ru (0.9)/CoFe (3)/MgO (x)/CoFeB (3)/capping layer. As shown in FIG. 5A, MTJ with fully crystalline CoFe single reference layer provides noticeable drop of MR ratio to 35% from 130% by CoFeB amorphous reference layer. And the shape of full hysteresis loop, FIG. 5B, from MTJ with fully crystalline CoFe single reference layer after as-deposition annealing at 360° C. for 2 hrs under 10 kOe magnetic field indicates that the poor or destroyed SAF structure, whereas that of MTJ, as shown in FIG. 5C, with amorphous CoFeB single reference layer after same condition of post-deposition annealing shows clear SAF coupling in the circle mark.

Body-centered-cubic CoFe tends to grow (110) atomic planes parallel to the interface with Ru in order for the lattice match with hexagonal-close-packed Ru (0001) basal plane. (110) out-of-plane texture of ferromagnetic reference layer is not preferable for the giant TMR from the theoretical calculation by Butler et al. in MgO-based MTJ. Furthermore, the thermal stability of SAF(CoFeB/Ru/CoFe) is much worse than that of SAF(CoFeB/Ru/CoFeB), thus clearly distinctive magnetization separation between constituent ferromagnetic layers cannot be secured if the MTJ is composed of CoFeB/Ru/CoFe SAF structure after high temperature post-deposition annealing. Thus the crystalline CoFe single reference layer is proven to be not effective to achieve the good crystallinity of MgO tunnel barrier.

Consequently, it can be understood that the poor crystallinity of MgO tunnel barrier deposited by oxidation method or reactive sputtering cannot play a role of crystallization template to crystallize amorphous CoFeB into CoFe at the CoFeB/MgO interface. Thus no grain-to-grain pseudo-epitaxy can be expected in CoFe/MgO/CoFe layers, which results in the poor magnetotransport property.

CITATION LIST

Patent Literature

[Patent Literature 1] T. Zhao et al., US Patent Application Publication No. US2007/0111332
[Patent Literature 2] S. Miura et al., Japan Patent Application Publication No. 2008-135432
[Patent Literature 3] K. Nishimura et al., Japan Patent Application Publication No. 2008-103661

Non Patent Literature

[Non Patent Literature 1] W. H. Butler et al., Phys. Rev. B 63, 054416 (2001).
[Non Patent Literature 2] S. Yuasa et al., Appl. Phys. Lett. 87, 222508 (2005).
[Non Patent Literature 3] S. S. P. Parkin et al., Nat. Mater. 3, 862 (2004).
[Non Patent Literature 4] D. Djayaprawira et al., Appl. Phys. Lett. 86, 092502 (2005).
[Non Patent Literature 5] Y. S. Choi et al., Appl. Phys. Lett. 90, 012505 (2007).
[Non Patent Literature 6] Y. S. Choi et al., J. Appl. Phys. 101, 013907 (2007).
[Non Patent Literature 7] B. Park et al. J. Magn. Magn. Mat., 226-230, 926 (2001).
[Non Patent Literature 8] S. C. Oh et al., IEEE Trans. Magn., 42, 2642 (2006).
[Non Patent Literature 9] S. Tehrani et al., IEEE Trans. Magn., 91, 703 (2003).

SUMMARY OF INVENTION

The objective of the present invention is to provide satisfactory high MR ratio at low R×A product for the application to the spin transfer torque MRAM and the recording read-head from the MTJ with MgO tunnel barrier, which is prepared by the metal deposition followed by the various oxidation methods or prepared by the reactive sputtering and the microstructure of which is amorphous or microcrystalline tunnel barrier with poor (001) out-of-plane texture.

According to a first aspect of the present invention, it is critical to crystallize or induce the preferred grain growth in the MgO tunnel barrier prepared by the metal deposition followed by the various oxidation methods or prepared by the reactive sputtering.

According to a second aspect of the present invention, the crystallization or the preferred grain growth of the MgO tunnel barrier, which is amorphous or microcrystalline with poor (001) out-of-plane texture in as-grown state, can be achieved during the post-deposition annealing by use of crystalline ferromagnetic PGGP seed layer with body-centered-cubic structure under or sandwiching the MgO tunnel barrier.

According to a third aspect of the present invention, the microstructure of MTJ with MgO tunnel barrier after post-deposition annealing is eventually overall (001) out-of-plane texture of the ferromagnetic reference layer, MgO tunnel barrier and the ferromagnetic free layer.

According to a forth aspect of the present invention, the MTJ device includes an antiferromagnetic pinning layer, a synthetic antiferromagnetic pinned layer, a tunnel barrier and a ferromagnetic free layer. The synthetic antiferromagnetic pinned layer includes a ferromagnetic pinned layer, a non-magnetic spacer and a ferromagnetic reference layer.

It is preferred that the ferromagnetic reference layer is formed in bi-layer structure, in that the first amorphous ferromagnetic reference layer deposited on the non-magnetic spacer and the second crystalline ferromagnetic reference layer, which is PGGP seed layer, deposited on the said first amorphous ferromagnetic reference layer.

It is preferred that the first amorphous ferromagnetic reference layer in the bi-layer-structured ferromagnetic reference layer is the ternary alloy containing Co, Fe and B, in which the content of boron is higher than 12 atomic %.

It is preferred that the thickness of the first amorphous ferromagnetic reference layer in the bi-layer-structured ferromagnetic reference layer is between 1 nm to 4 nm.

It is preferred that the second crystalline ferromagnetic reference layer, which is PGGP seed layer, in the bi-layer-structured ferromagnetic reference layer is the binary alloy of $Co_xFe_{100-x}$, in which $0<x<80$.

It is preferred that the second crystalline ferromagnetic reference layer, which is PGGP seed layer, in the bi-layer-structured ferromagnetic reference layer can also be formed by single Fe element.

It is preferred that the second crystalline ferromagnetic reference layer, which is PGGP seed layer, in the bi-layer-structured ferromagnetic reference layer can also be the ternary alloy containing Co, Fe and B, in which the content of boron is less than 12 atomic %, thus crystalline ternary alloy whose content of boron is less than 12 atomic %.

It is preferred that the thickness of the second crystalline ferromagnetic reference layer in the bi-layer-structured ferromagnetic reference layer is between 0.5 nm to 2 nm.

It is preferred that the thickness of the second crystalline ferromagnetic reference layer in the bi-layer-structured ferromagnetic reference layer is equal to or less than the thickness of the said first amorphous ferromagnetic reference layer in the bi-layer-structured ferromagnetic reference layer.

It is preferred that the MgO tunnel barrier, which is amorphous or microcrystalline with poor (001) out-of-plane texture, is prepared by the deposition of metallic Mg layer, the oxidation of the said metallic Mg layer by radical oxidation, plasma oxidation, natural oxidation or ozone oxidation, then finally deposition of the metallic Mg cap layer after oxidation.

It is preferred that the MgO tunnel barrier, which is amorphous or microcrystalline with poor (001) out-of-plane texture, can also be prepared by the deposition of partially or fully oxidized Mg-oxide layer using reactive sputtering, the oxidation of the said partially or fully oxidized Mg-Oxide layer by radical oxidation, plasma oxidation, natural oxidation or ozone oxidation, then finally metallic Mg cap layer after oxidation.

It is preferred that the ferromagnetic free layer also can be formed in bi-layer structure, in that the first crystalline ferromagnetic free layer, which is PGGP seed layer, deposited on the MgO tunnel barrier and the second amorphous ferromagnetic free layer deposited on the said first crystalline ferromagnetic free layer.

It is preferred that the first crystalline ferromagnetic free layer, which is PGGP seed layer, in the bi-layer-structured ferromagnetic free layer is the binary alloy of $Co_xFe_{100-x}$, in which $0<x<80$.

It is preferred that the first crystalline ferromagnetic free layer, which is PGGP seed layer, in the bi-layer-structured ferromagnetic free layer can also be formed by single Fe element.

It is preferred that the first crystalline ferromagnetic free layer, which is PGGP seed layer, in the bi-layer-structured ferromagnetic free layer can also be the ternary alloy containing Co, Fe and B, in which the content of boron is less than 12 atomic %, thus crystalline ternary alloy whose content of boron is less than 12 atomic %.

It is preferred that the thickness of the first crystalline ferromagnetic free layer, which is PGGP seed layer, in the bi-layer-structured ferromagnetic free layer is between 0.5 nm to 2 nm.

It is preferred that the second amorphous ferromagnetic free layer in the bi-layer-structured ferromagnetic free layer is the ternary alloy containing Co, Fe and B, in which the content of boron is higher than 12 atomic %.

It is preferred that the thickness of the second amorphous ferromagnetic free layer in the bi-layer-structured ferromagnetic free layer is between 1 nm to 4 nm.

It is preferred that the magnetic tunnel junction device with crystalline ferromagnetic layer inserted between the amorphous ferromagnetic layer and the amorphous or microcrystalline MgO tunnel barrier with poor (001) out-of-plane texture shows significantly reduced resistance-area product and noticeably increased magnetoresistance ratio compared to the magnetic tunnel junction device without the insertion of the crystalline ferromagnetic layer, which is the PGGP seed layer, inserted between the amorphous ferromagnetic layer and the amorphous or microcrystalline MgO tunnel barrier with poor (001) out-of-plane texture.

It is preferred that the resistance-area product and the magnetoresistance ratio of the magnetic tunnel junction device with crystalline ferromagnetic layer, which is the PGGP seed layer, inserted between the amorphous ferromagnetic layer and the amorphous or microcrystalline MgO tunnel barrier with poor (001) out-of-plane texture are less than 5 $\Omega\mu m^2$ and higher than 170%, respectively.

The existence of the second crystalline ferromagnetic reference layer and/or the said first crystalline ferromagnetic free layer, which are PGGP seed layers, induce the crystallization and the preferred grain growth of the MgO tunnel barrier, which is amorphous or microcrystalline tunnel barrier with poor (001) out-of-plane texture in as-deposited state, after post-deposition annealing, as schematically described in FIG. 6A.

Also the existence of the second crystalline ferromagnetic reference layer and/or the said first crystalline ferromagnetic free layer, which are PGGP seed layers, induce the crystallization and the preferred grain growth of the said first ferromagnetic amorphous reference layer and/or the said second ferromagnetic amorphous free layer, which are amorphous in as-deposited state, after post-deposition annealing, as schematically described in FIG. 6A.

Therefore, the microstructure of MTJ after post-deposition annealing is eventually overall (001) out-of-plane texture of the ferromagnetic reference layer, MgO tunnel barrier and the ferromagnetic free layer. With this obtained microstructure of MTJ of the present invention, it is possible to achieve the significant increase of MR ratio as well as the noticeable reduction of R×A product, as shown in FIG. 6A. However, optimum annealing temperature of MTJ with bi-layer-structured ferromagnetic reference layer and/or bi-layer-structured ferromagnetic reference layer of the present invention cannot be lower than that of MTJ with rf-sputtered crystalline MgO and the single-layered amorphous ferromagnetic reference layer and free layer. It is easy to explain this increase of optimum annealing temperature by the difference of crystallization object. The layers to be crystallized in the MTJ of the present invention are the MgO tunnel barrier and the amorphous ferromagnetic layers, as shown in FIG. 6A, whereas the layers to be crystallized in the MTJ with rf-sputtered crystalline MgO are the amorphous ferromagnetic layers only, as shown in FIG. 6B. As the melting point of CeFe is much lower than that of MgO (thus the recrystallization temperature would correspond accordingly), it can be intuitively known that the temperature required to crystallize the CoFe would be lower than that for MgO.

Similar structure of bi-layered ferromagnetic reference layer has been suggested by Miura et al. in Japanese patent application JP 2008-135432, which suggests the insertion of the amorphous or microcrystalline CoFe layer between the amorphous ferromagnetic CoFeB layer and the crystalline MgO tunnel barrier. It is claimed that the insertion of amorphous or microcrystalline CoFe layer effectively lowers the annealing temperature down to 300° C. by the crystallization template effect of the crystalline MgO tunnel barrier. However, this is not applicable to the MTJ with MgO tunnel barrier prepared by oxidation methods or the reactive sputtering as the MgO tunnel barrier is amorphous or microcrystalline with poor (001) out-of-plane texture in as-deposited state.

Also Nishimura et al. (Patent Reference 3) has suggested the identical bi-layered ferromagnetic layer, which is the insertion of the amorphous or microcrystalline CoFe layer between the amorphous ferromagnetic CoFeB layer and the crystalline MgO tunnel barrier under the MgO tunnel barrier in the Japanese patent application JP 2008-103661. Despite this patent application covers the MgO preparation methods including rf sputtering and oxidation methods, only rf-sputtered MgO tunnel barrier, which is highly probable to be good crystalline, is suggested in the preferred embodiment and the MgO tunnel barrier deposited by reactive sputtering is not included. As mentioned above, it is hard to apply same argument of using the crystalline MgO as a crystallization template for high MR ratio to the MTJ with MgO tunnel barrier which is amorphous or microcrystalline with poor (001) out-of-plane texture in as-deposited state.

BRIEF DESCRIPTION OF DRAWINGS

(FIG. 2A) XRD theta-2 theta scan from MgO thin film, (FIG. 2B) XRD theta-2 theta scan from MgO-based MTJ (evolution of crystalline CoFe with annealing temperature), (FIG. 2C) comparison of MR ratio vs. R×A product from MTJs with MgO with or without (002) texture.

(FIG. 4A) a photograph of cross-section HREM image from MTJ with MgO prepared by rf-sputtering, (FIG. 4B) a photograph of cross-section HREM image from MTJ with MgO prepared by radical oxidation, (FIG. 4C) XRD theta-2 theta scan comparing the crystallinity and texture of MgO tunnel barrier prepared by rf-sputtering and natural oxidation, (FIG. 4D) XPS O 1s spectrum obtained from MgO prepared by rf-sputtering, and (FIG. 4E) XPS O 1s spectrum obtained from MgO prepared by reactive sputtering.

(FIG. 5A) MR ratio vs. R×A product from MTJs with CoFe or CoFeB reference layer, and full hysteresis loops from MTJ with (FIG. 5B) CoFe reference layer and (FIG. 5C) CoFeB reference layer.

(FIG. 6A) MTJ in the present invention with crystalline ferromagnetic PGGP seed layers sandwiching amorphous or microcrystalline MgO with poor (001) out-of-plane texture and (FIG. 6B) MTJ with amorphous ferromagnetic CoFeB layers sandwiching highly crystalline MgO.

FIG. 8C shows schematic of MTJ in the third embodiment of the invention.

FIG. 8D shows schematic of MTJ in the forth embodiment of the invention.

(FIG. 20A) CoFe PGGP seed layer sandwiched by MgO tunnel barrier and CoFeB layer, (FIG. 20B) growth of CoFe PGGP seed layer with (001) out-of plane, and (FIG. 20C) growth of CoFe PGGP seed layer with (011) out-of-plane.

DETAILED DESCRIPTION OF THE INVENTION

Figure 7:
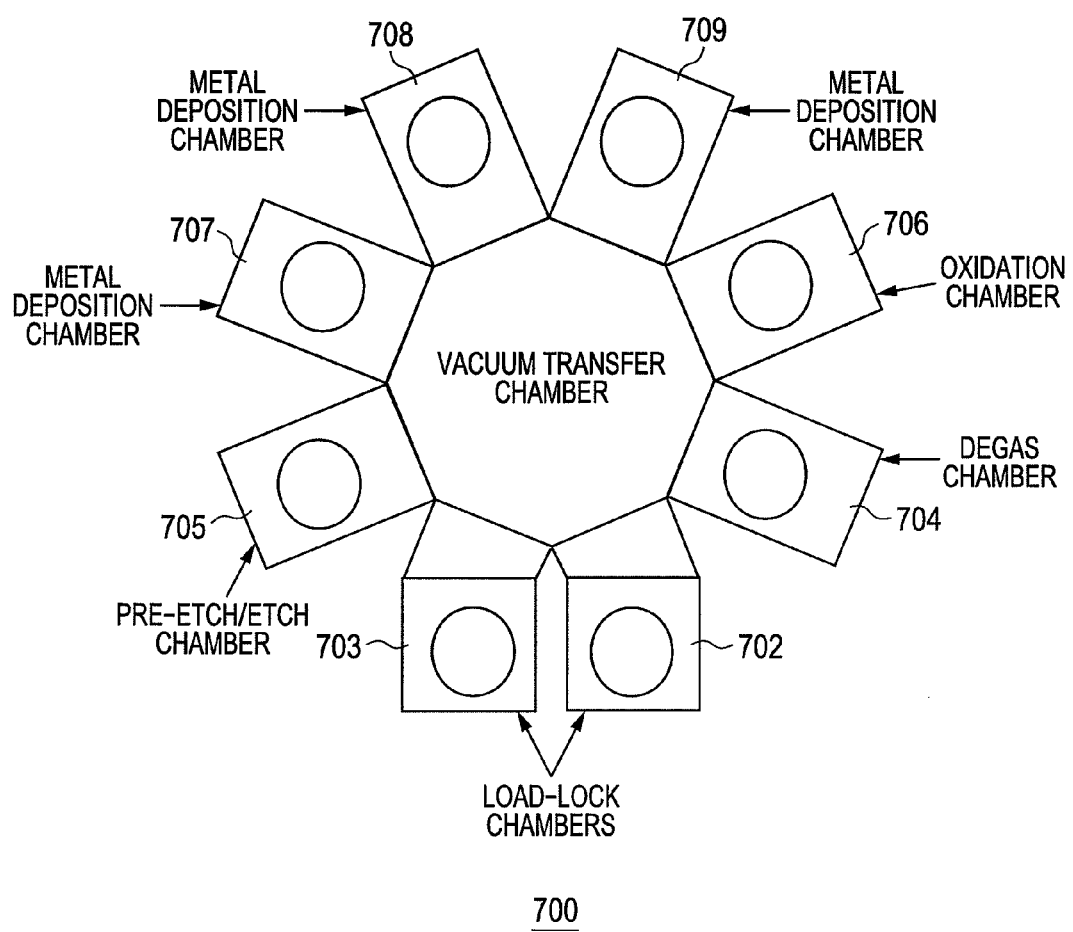
FIG. 7 exemplifies a MTJ device manufacturing apparatus.

FIG. 7 exemplifies a MTJ device manufacturing apparatus in the preferred embodiment. FIG. 7 is a schematic plan view of a vacuum processing system 700 for fabricating a magnetic tunnel junction device. A vacuum processing system shown in FIG. 7 is a cluster type system providing a plurality of thin film deposition chambers using physical vapor deposition technique. Plurality of deposition chambers in the said vacuum processing system is attached to the vacuum transfer chamber 701 provided with robot loaders at the center position (not shown). The said vacuum processing system 700 is equipped with two load-lock chambers 702 and 703 to load/ unload substrates. The said vacuum processing system is equipped with degas chamber 704 and pre-etch/etch chamber 705. The vacuum processing system is equipped with oxidation chamber 706 and plurality of metal deposition chambers 707, 708, and 709. Each of chambers in the vacuum processing system is connected through a gate valve in order to open/close the passage between the chambers. Note that each of chambers in the vacuum processing system is equipped with pumping system, gas introduction system, and power supply system. Moreover, the gas introduction system comprises flow-regulating means, the pumping system comprises pressure regulating means. Each operation of the flow regulating means and the pressure regulating means can control a certain pressure in the chamber during a certain period of time. Moreover, operations based on combination of the flow regulating means and the pressure regulating means can control the certain pressure in the chamber during the certain period of time.

In each of the metal deposition chambers 707, 708, and 709 of the said vacuum processing system 700, each of the magnetic layers and the non-magnetic metal layers is deposited on the substrate one by one by the sputtering method. In the metal deposition chambers 707, 708, and 709, for example, a material of a target is "CoFe", a material of a target is "Ru", a material of a target is "CoFeB", and a material of a target is "Mg". And a material of a target is "antiferromagnetic material", a material of a target is "seed material", a material of a target is "capping material". Furthermore, a material of a target is "top electrode material" and a material of a target is "bottom electrode material". Pre-etching and etching are carried out in the pre-etch/etch chamber. Oxidation is carried out in the oxidation chamber 706. Moreover, each metal deposition chamber comprises a sputtering apparatus which can perform dc-sputtering. Procedures, such as gas introduction into each chamber, switching the valve, power supply ON/OFF, an exhaust gas, and a substrate transfer, is carried out by a system controller (not shown).

Figure 1:
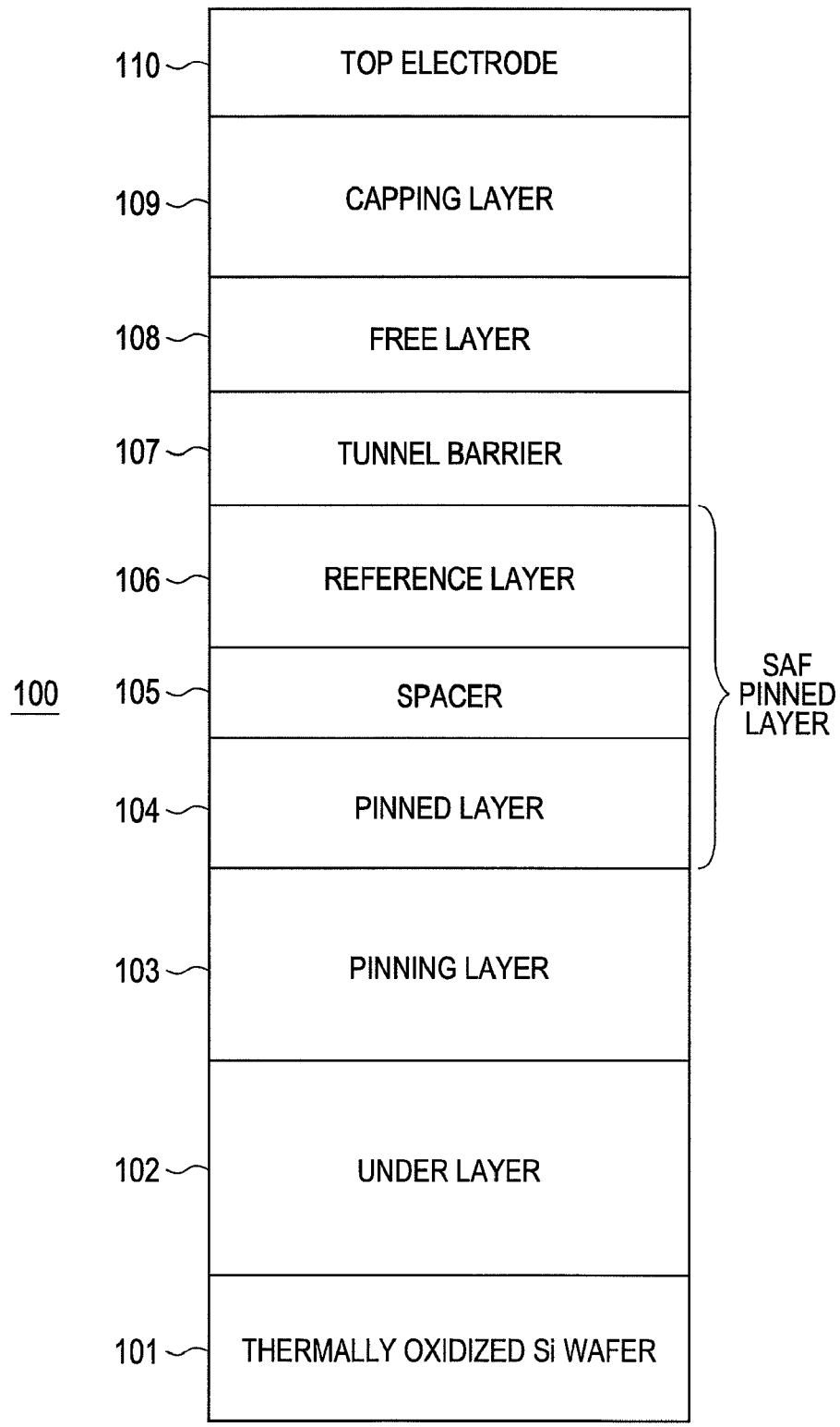
FIG. 1 is a schematic of a typical structure of the magnetic tunnel junction.
Figure 2A:
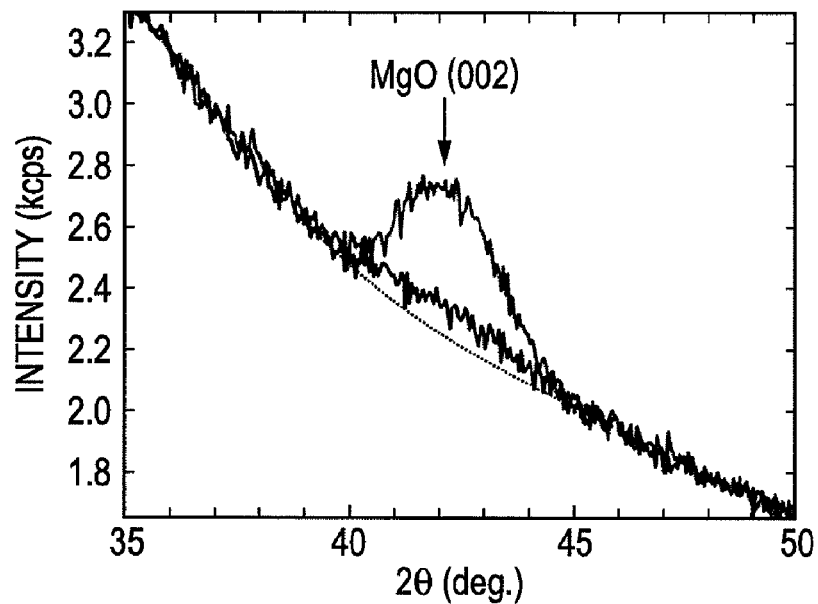
FIGS. 2A, 2B and 2C show the relationships between the microstructure of MgO-based MTJ and the magnetotransport properties.
Figure 2B:
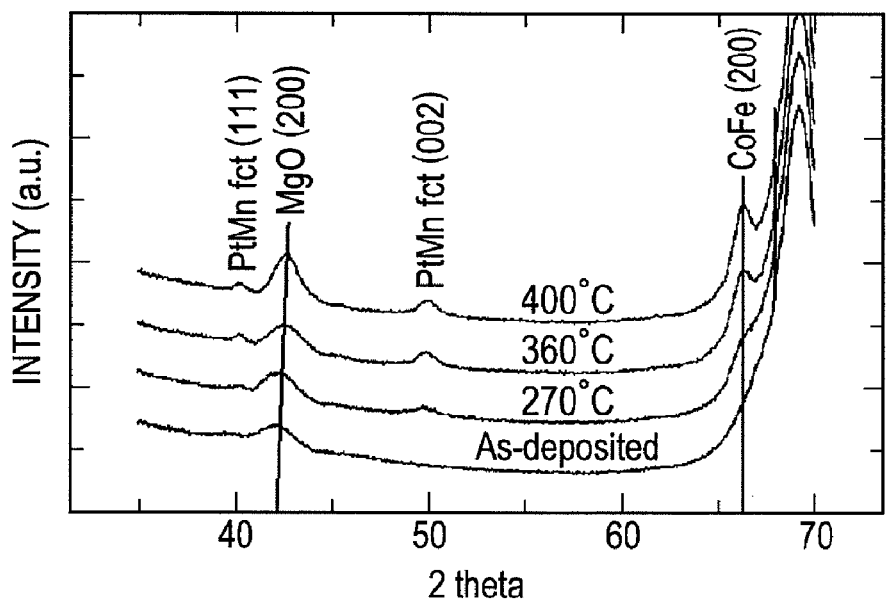
Figure 2C:
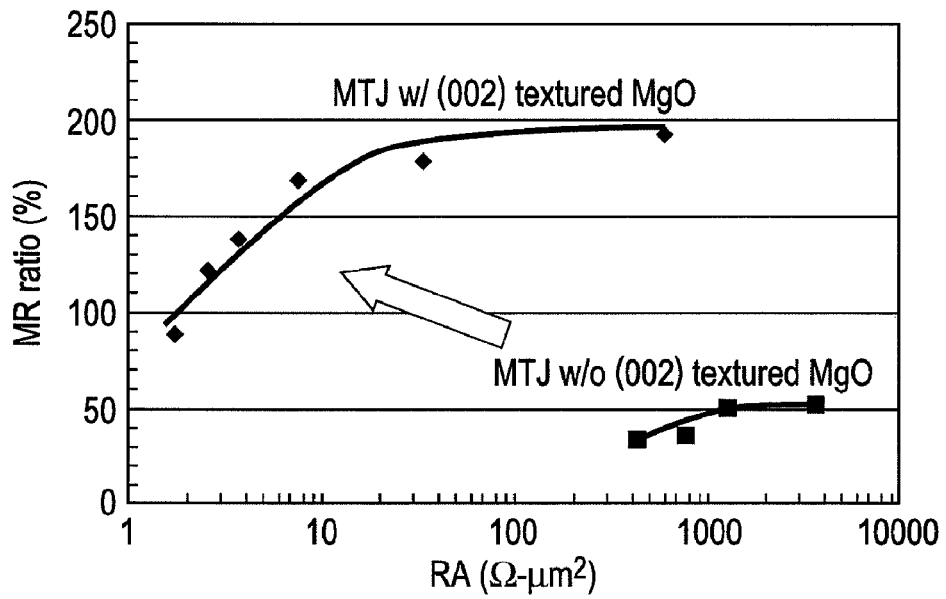
Figure 3:
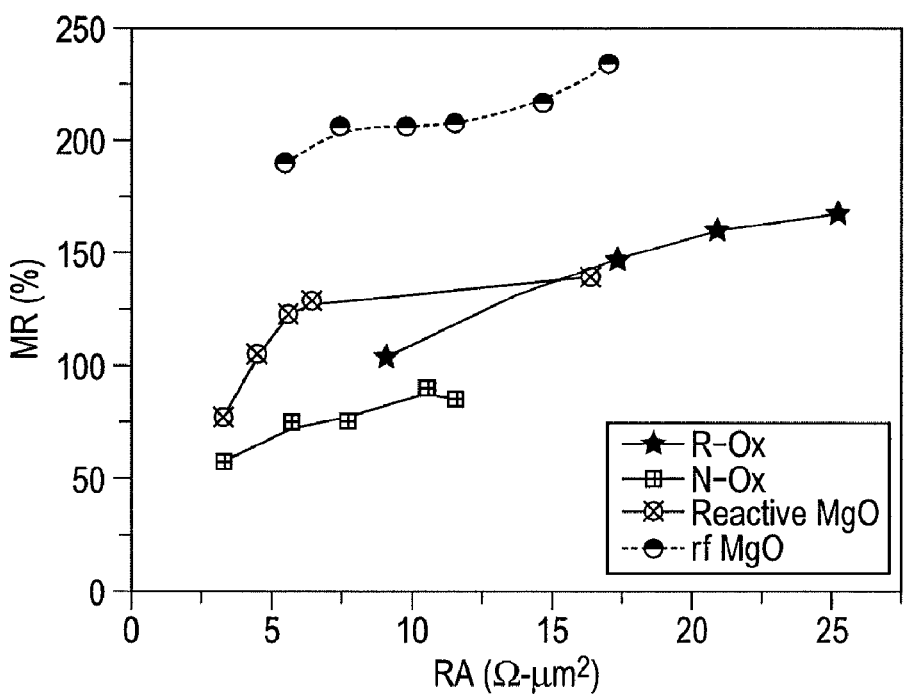
FIG. 3 shows the comparison of MR ratio vs. R×A product from MTJs with MgO prepared by various methods.
Figure 4A:
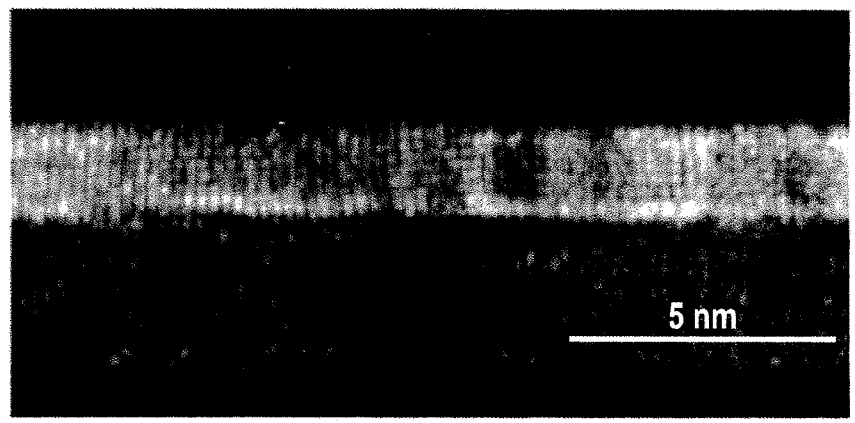
FIGS. 4A, 4B, 4C, 4D and 4E show the results of microstructure and the thin film chemistry analyses from MgO prepared by various methods.
Figure 4B:
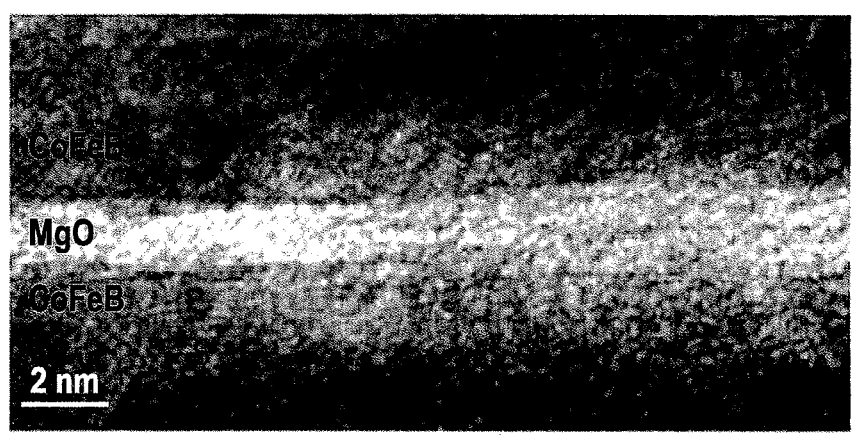
Figure 4C:
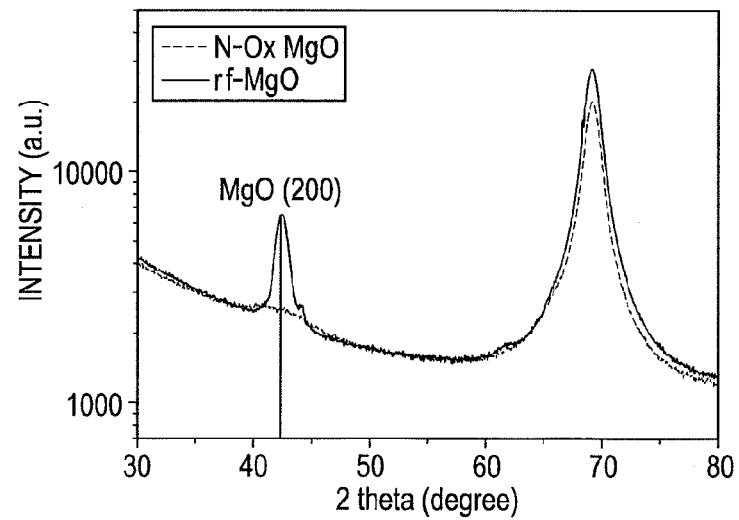
Figure 4D:
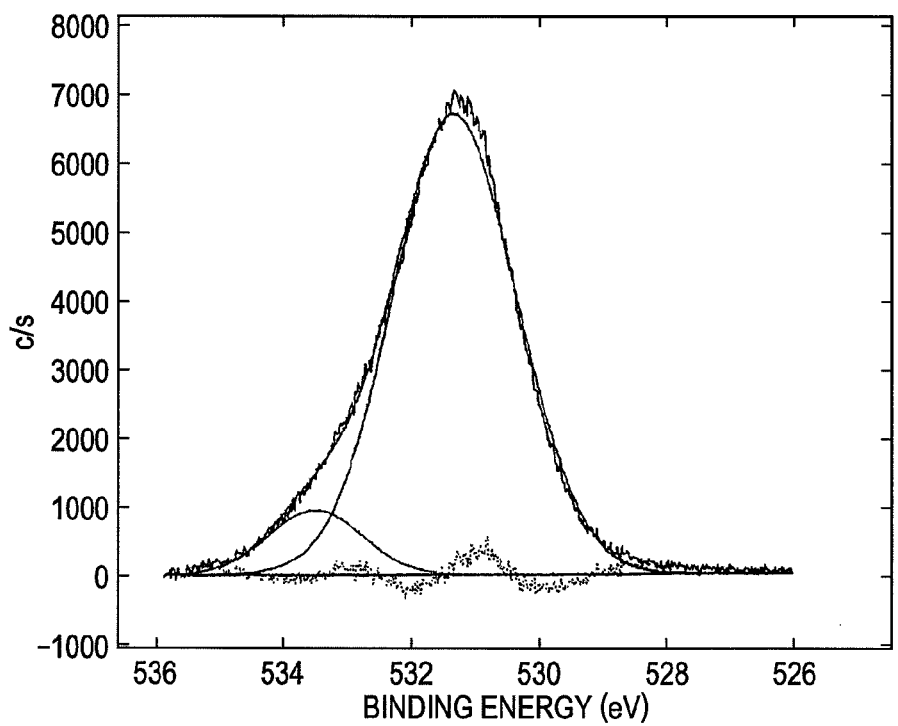
Figure 4E:
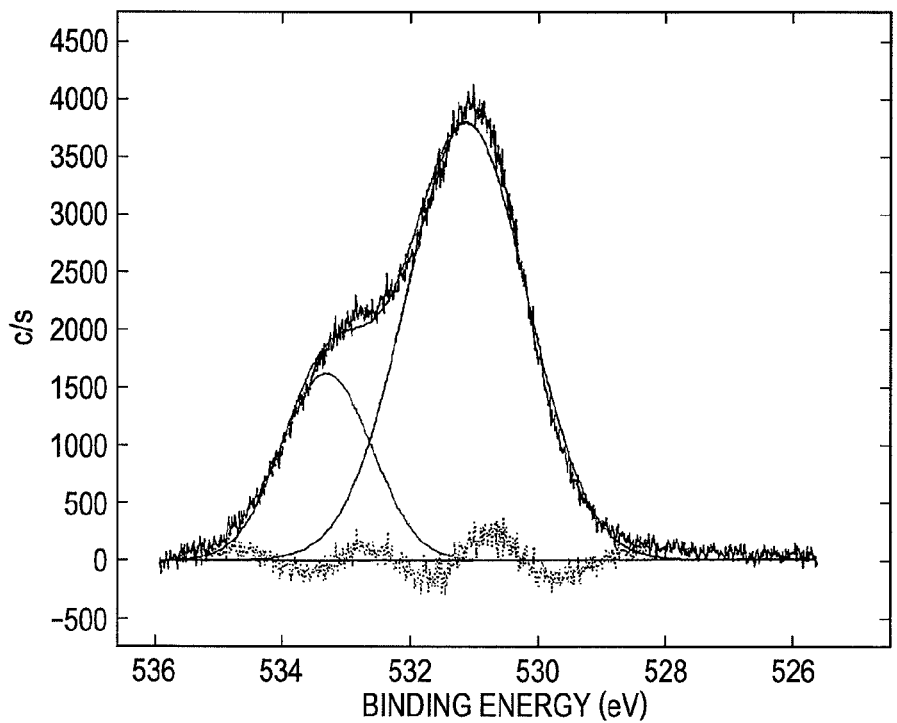
Figure 5A:
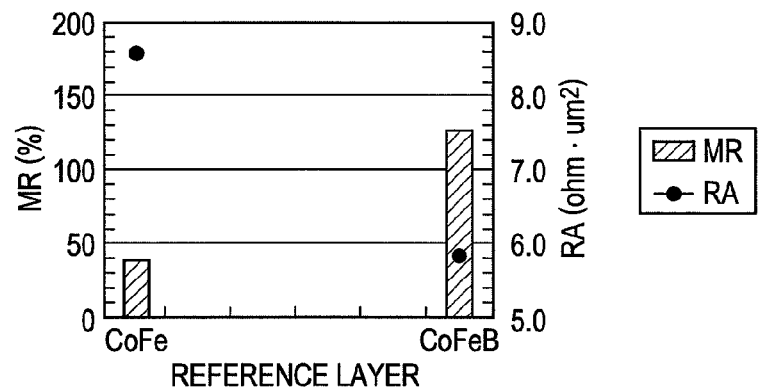
FIGS. 5A, 5B and 5C show the comparison of magnetotransport property and the hysteresis loops of MTJs with ferromagnetic single reference layer of CoFe or CoFeB.
Figure 5B:
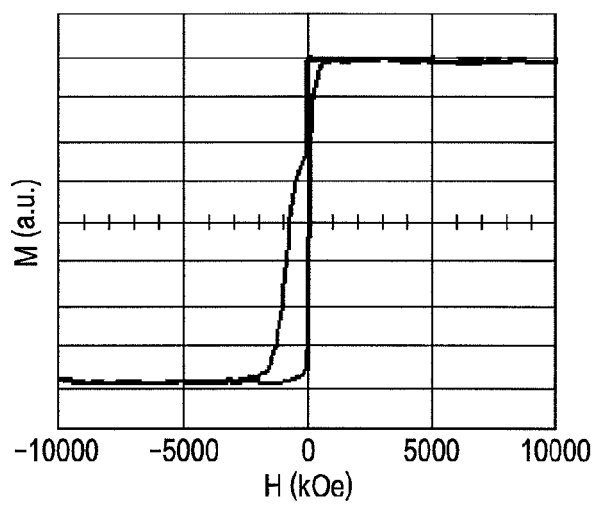
Figure 5C:
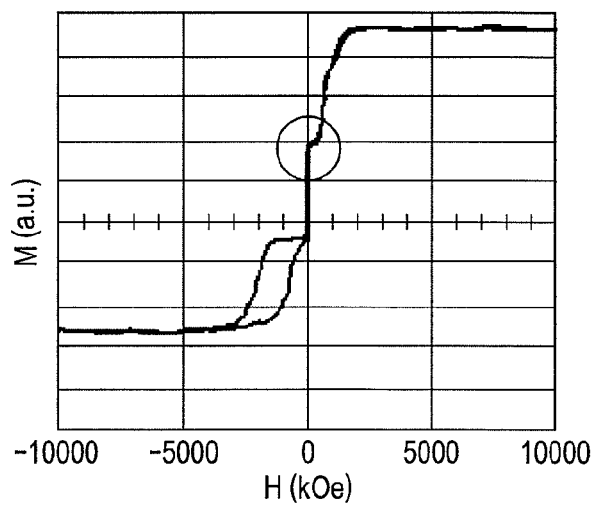
Figure 6A:
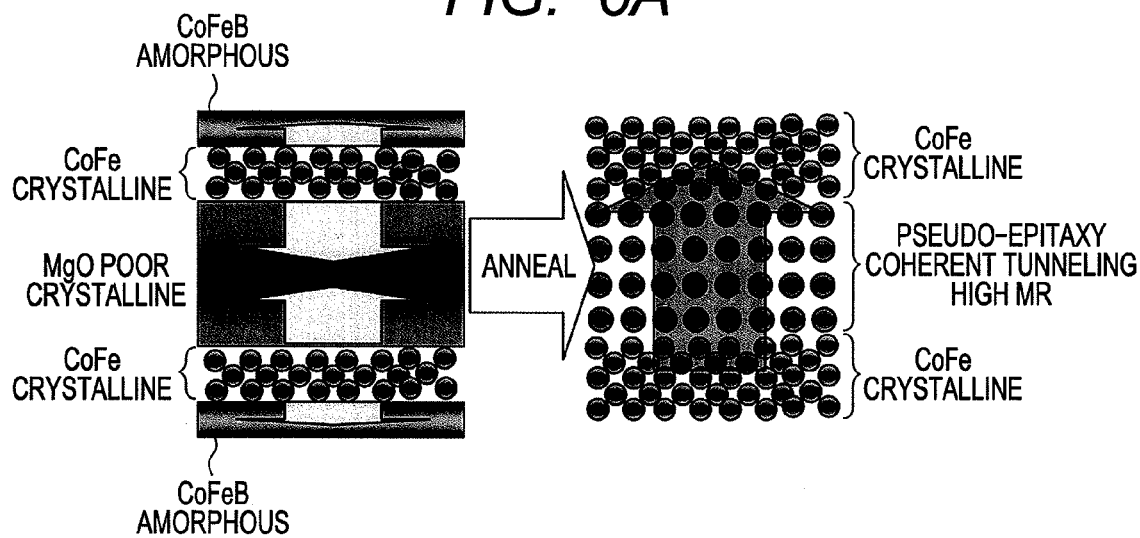
FIG. 6A and FIG. 6B are the schematic comparison of crystallization and preferred grain growth process of MTJ after post-deposition annealing.
Figure 6B:
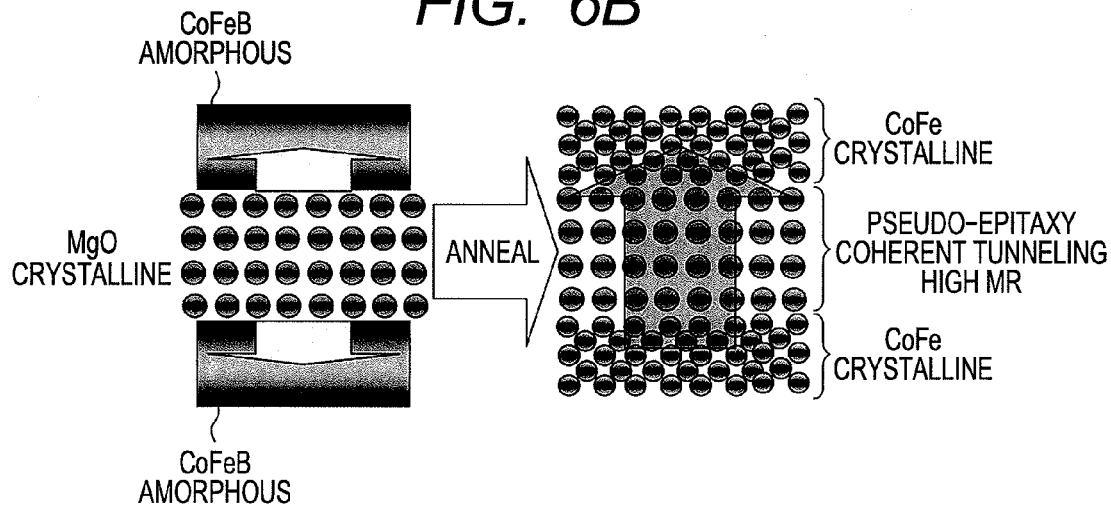

FIG. 1 shows a typical stack structure 100 of MTJ for tunneling magnetoresistance (TMR) sensor or memory cell. Most advantageously, on an under layer 102 and Si wafer 101 MTJ is composed of an antiferromagnetic pinning layer 103, a synthetic antiferromagnetic (SAF) pinned layer 110, a tunnel barrier 107 and a ferromagnetic free layer 108. A capping layer 109 on which top electrode 110 is attached is formed on the free layer 108. In the stack structure shown in FIG. 1, a synthetic antiferromagnetic pinned layer 110 is formed by including a ferromagnetic pinned layer 104, a non-magnetic spacer 105 and a ferromagnetic reference layer 106.

The MTJ devices of the present invention are formed by preparation of the core element in the MTJ device, the core comprising "ferromagnetic pinned layer 104/non-magnetic spacer 105/ferromagnetic reference layer 106/tunnel barrier 107/ferromagnetic free layer 108" multilayer structure, using the combinations of materials selected from the following groups for the preferred embodiments.

Group 1: materials selection for the preferred grain growth promotion (PGGP) layer
   a. $Co_xFe_{100-x}$, where 0<x atomic %<80
   b. $(Co_xFe_{100-x})_yB_{100-y}$, where 0<x atomic %<80 and 88<y atomic %<100
   c. Fe Group 2: Method of MgO tunnel barrier deposition
   d. Mg xÅ/oxidation process*/Mg yÅ
   e. Mg xÅ/oxygen surfactant/Mg xÅ/oxidation process*/Mg yÅ
   f. Mg xÅ/oxidation process*/Mg yÅ/oxidation process*/Mg zÅ
   g. Reactive sputtering MgOx/Oxidation process*/Mg yÅ
   h. Mg xÅ/Reactive sputtering MgOx/oxidation process*/Mg yÅ
      Oxidation process* includes plasma, natural, radical and ozone oxidation.

Group 3: Position of the PGGP layer
   i. Reference layer only
   j. Reference and free layers Group 4: Selection of pinned layer
   k. CoFeB single layer
   l. CoFeB/CoFe bi-layer First Embodiment The first embodiment is a method of forming the tunnel barrier of MTJ devices by radical oxidation method and the employment of CoFe as the preferred grain growth promotion seed layer, in that the core element of the MTJ is formed by the combination of (a+d+i+k) or (a+d+j+k) of the group 1, 2, 3 and 4 mentioned above.

Figure 8A:
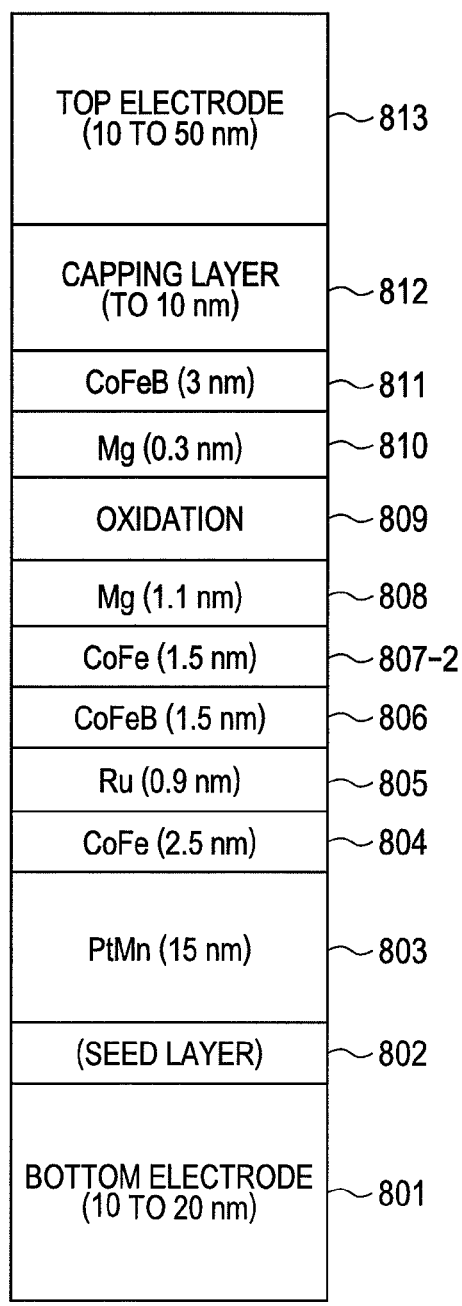
FIG. 8A and FIG. 8B show schematics of MTJs in the first and second embodiments of the invention with CoFe PGGP seed layer (FIG. 8A) only in reference layer and (FIG. 8B) in both of reference and free layer.
Figure 8B:
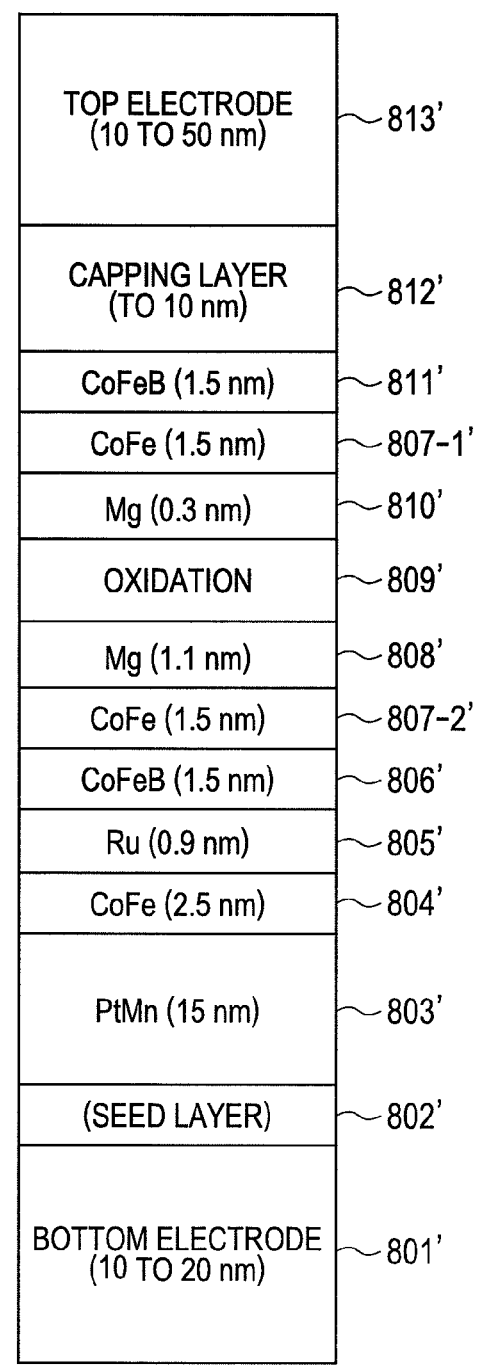

Two different configurations of MTJ stacks, as illustrated in FIG. 8A and FIG. 8B are used in the first embodiment as follows;
A stack (see FIG. 8A): Bottom layers (801, 802)/PtMn15 (803)/CoFe2.5 (804)/Ru0.9 (805)/CoFeB1.5 (806)/CoFe1.5 (807-2)/Mg1.1 (808)/R-Ox x seconds (809)/Mg0.3 (810)/CoFeB3 (811)/Capping layers (812)/Top electrode (813),
B stack (see FIG. 8B): Bottom layers (801', 802')/PtMn15 (803')/CoFe2.5 (804')/Ru0.9 (805')/CoFeB1.5 (806')/CoFe1.5 (807-2')/Mg1.1 (808')/R—Ox x seconds (809')/Mg0.3 (810')/CoFe1.5 (807-1')/CoFeB1.5 (811')/Capping layers (812')/Top electrode (813'),
where unbracketed numbers are thickness in nanometer scale and the PGGP seed layer is indicated by underline.

Referring to FIG. 8A and FIG. 8B, one of important aspect of the first embodiment is the insertion of the preferred grain growth promotion (PGGP) seed layer, which is the second crystalline CoFe ferromagnetic reference layer 807-2, 807-2' and/or the first crystalline CoFe ferromagnetic free layer 807-1', under or sandwiching the MgO tunnel barrier.

The first amorphous Co(60 at. %)Fe(20 at. %)B(20 at. %) ferromagnetic reference layer 806, 806' with thickness of 1.5 nm is deposited on the non-magnetic Ru spacer layer 805, 805'. The second crystalline ferromagnetic Co(70 at. %)Fe (30 at. %) reference layer 807-2, 807-2', which is the preferred grain growth promotion seed layer, is deposited with thickness of 1.5 nm on the first amorphous ferromagnetic reference layer 806, 806'.

The method of forming the MgO tunnel barrier is as follows;
deposition of first metallic Mg layer 808, 808' on the second crystalline ferromagnetic reference layer 807-2, 807-2', which is the preferred grain growth promotion seed layer, with thickness of 1.1 nm,
oxidation of the first metallic layer 808, 808' by radical oxidation carried out in the oxidation chamber, in which electrically-ground "shower plate" is placed between an upper ionizing electrode and the substrate. Oxygen plasma is generated by applying 300 W of rf power to the ionizing electrode with oxygen flow of 700 sccm. Oxygen radical shower flows through the shower plate, whereas particles with electric charge, such as ionized species and electrons, cannot pass through due to the electric grounding of shower plate, and deposition of the metallic Mg cap layer 810, 810' with thickness of 0.3 nm on the first metallic Mg layer oxidized by radical oxidation.

With reference to FIG. 8A, the amorphous Co(60 at. %)Fe (20 at. %)B(20 at. %) ferromagnetic single free layer 811 with thickness of 3 nm is deposited on the metallic Mg cap layer 810.

Also with reference to FIG. 8B, the first crystalline ferromagnetic Co(70 at. %)Fe(30 at. %) free layer 807-1', which is the preferred grain growth promotion seed layer, is deposited with thickness of 1.5 nm on the metallic Mg cap layer 810'. Then the second amorphous Co(60 at. %)Fe(20 at. %)B(20 at. %) ferromagnetic free layer 811' with thickness of 1.5 nm is deposited on the first crystalline ferromagnetic free layer 807-1'.

Post-deposition magnetic field annealing is carried out at 360° C. for 2 hour under 10 kOe magnetic field. The purposed of post-deposition annealing is the crystallization of the first amorphous ferromagnetic reference layer 806, 806' and/or the second amorphous ferromagnetic free layer 811, 811' and the preferred grain growth of the said amorphous or microcrystalline MgO tunnel barrier with poor (001) out-of-plane texture. This crystallization and the preferred grain growth are realized using the second crystalline CoFe ferromagnetic reference layer 807-2, 807-2' and/or the first crystalline CoFe ferromagnetic free layer 807-1' as adjacent crystallization or preferred grain growth seed layer during annealing, thus eventually overall (001) out-of-plane texture of the ferromagnetic reference layer, MgO tunnel barrier and the ferromagnetic free layer.

Figure 9A:
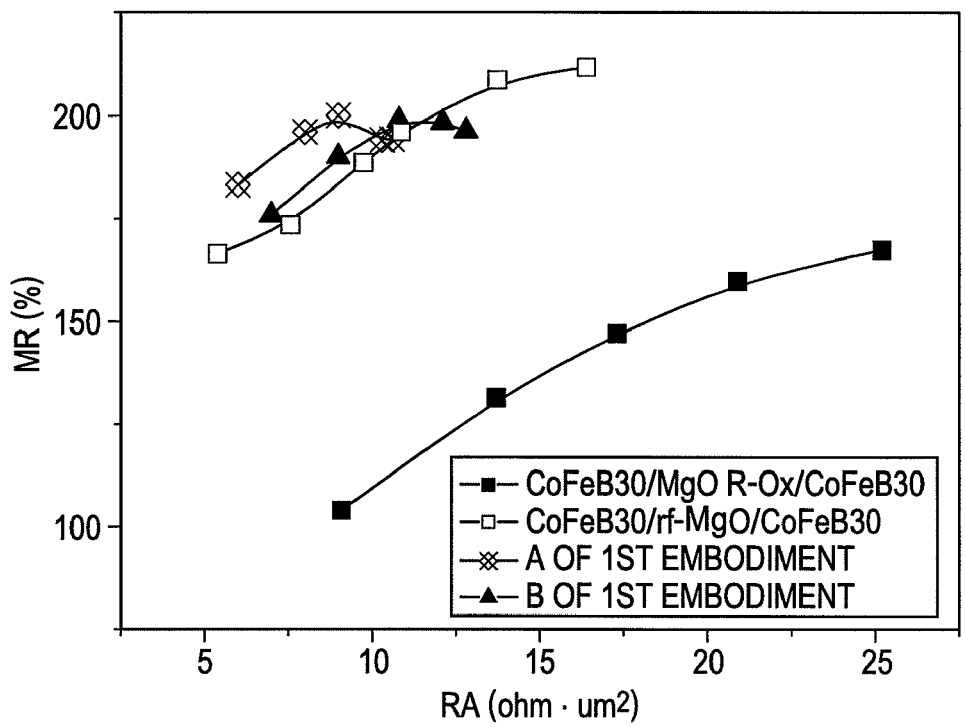
FIG. 9A shows the magnetotransport property comparison of A and B MTJ stacks of the first embodiment of the present invention compared to that of MTJs with MgO prepared by rf-sputtering and radical oxidation without PGGP seed layer and FIG. 9B shows MR ratio and R×A product comparison of A and B MTJ stacks of the first embodiment with respect to the reference identical MTJ stack only without PGGP seed layer.
Figure 9B:
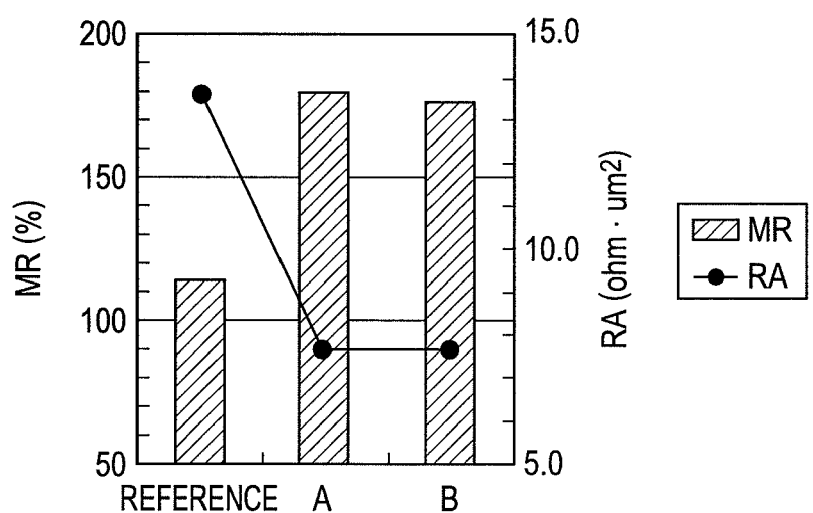

With reference to FIG. 9A and FIG. 9B, the magnetotransport properties of the MTJ prepared by the method of the present invention were measured using CIPT method. In order for comparison, the MTJ with MgO tunnel barrier prepared by rf sputtering and the MTJ with MgO tunnel barrier prepared by same oxidation method, in both of which crystalline CoFe PGGP seed layer is not employed, are shown as reference. As shown in FIG. 9A, with reference to the MR ratio and R×A product obtained from the MTJ with MgO prepared by same oxidation method but without the insertion of the crystalline PGGP seed layer, it is apparent that the MTJ which employs the crystalline PGGP layer shows much improved magnetotranport properties, in that noticeable increase of MR ratio is obtained with significant reduction of R×A product, which is comparable to or even better than those from MTJ with MgO tunnel barrier prepared by rf sputtering. At given R×A product of about 9 $\Omega\mu m^2$, MTJ with MgO prepared by radical oxidation without the crystalline CoFe PGGP seed layer provides MR ratio of 103%, whereas the MTJs with MgO deposited by radical oxidation with the crystalline CoFe PGGP seed layer, A stack and B stack, provide 200% and 190%, respectively, which are comparable to or even higher than 185% obtained from the MTJ with MgO tunnel barrier prepared by rf sputtering without the crystalline PGGP seed layer. Clear evidence of R×A product reduction and MR ratio increase is shown in FIG. 9B. Only difference between reference and A and B is whether the MTJ employs the crystalline PGGP seed layer or not. The radical oxidation condition for all samples are identical; 300 W, 700 sccm and 10 seconds. By use of the crystalline PGGP seed layer, R×A product drops from 14 $\Omega\mu m^2$ to 7.5 $\Omega\mu m^2$, which roughly drops by half, and MR ratio increases from 110% to 180%.

Based on the previous studies correlating magnetotransport property and the crystallinity and pseudo-epitaxy in MTJ, it can be intuitively inferred that the insertion of the crystalline CoFe PGGP seed layer adjacent the MgO tunnel barrier, which is amorphous or microcrystalline with poor (001) out-of-plane texture, induces the crystallization and the preferred grain growth of the MgO tunnel barrier during the post-deposition annealing.

Second Embodiment

The second embodiment is a method of forming the tunnel barrier of MTJ devices by natural oxidation method and the employment of CoFe as the preferred grain growth promotion seed layer, in that the core element of the MTJ is formed by the combination of (a+d+i+k) or (a+d+j+k) of the group 1, 2, 3 and 4 mentioned above.

Two different configurations of MTJ stacks, as illustrated in FIG. 8A and FIG. 8B, are used in the second embodiment as follows;

A stack (see FIG. 8A): Bottom layers (801, 802)/PtMn15 (803)/CoFe2.5 (804)/Ru0.9 (805)/CoFeB1.5 (806)/CoFe1.5 (807-2)/Mg1.1 (808)/N—Ox x seconds (809)/Mg0.3 (810)/CoFeB3 (811)/Capping layers (812)/Top electrode (813), B stack (see FIG. 8B): Bottom layers (801', 802')/PtMn15 (803')/CoFe2.5 (804')/Ru0.9 (805')/CoFeB1.5 (806')/CoFe1.5 (807-2')/Mg1.1 (808')/N—Ox x seconds (809')/Mg0.3 (810')/CoFe1.5 (807-1')/CoFeB1.5 (811')/Capping layers (812')/Top electrode (813'), where unbracketed numbers are thickness in nanometer scale and the PGGP seed layers are indicated by underline. Except for the natural oxidation, the stack configurations are same as those of the first embodiment.

Referring to FIG. 8A and FIG. 8B, which also illustrate configurations of the stacks A and B of the second embodiment, one of important aspect of the second embodiment is the insertion of the preferred grain growth promotion seed layer, which is the second crystalline CoFe ferromagnetic reference layer 807-2, 807-2' and/or the first crystalline CoFe ferromagnetic free layer 807-1', under or sandwiching the MgO tunnel barrier.

The first amorphous Co(60 at. %)Fe(20 at. %)B(20 at. %) ferromagnetic reference layer 806, 806' with thickness of 1.5 nm is deposited on the non-magnetic Ru spacer layer 805, 805'. The second crystalline ferromagnetic Co(70 at. %)Fe (30 at. %) reference layer 807-2, 807-2', which is the preferred grain growth promotion seed layer, is deposited with thickness of 1.5 nm on the first amorphous ferromagnetic reference layer 806, 806'.

The method of forming the MgO tunnel barrier is as follows;

deposition of first metallic Mg layer 808, 808' on the second crystalline ferromagnetic reference layer 807-2, 807-2', which is the preferred grain growth promotion seed layer, with thickness of 1.1 nm, oxidation of the first metallic layer 808, 808' by natural oxidation carried out in the oxidation chamber. The natural oxidation process, which is advantageously applied to the thinly formed metallic Mg layer, requires purging the oxidation chamber with oxygen gas at a pressure of approximately $6.5 \times 10^{-1}$ Pa and flowing the oxygen gas at the flow rate of 700 sccm, then leaving the as-deposited metallic Mg layer in contact with the oxygen gas flow for given exposure time, and deposition of the metallic Mg cap layer 810, 810' with thickness of 0.3 nm on the first metallic Mg layer 809, 809' oxidized by natural oxidation.

With reference to FIG. 8A, the amorphous Co(60 at. %)Fe (20 at. %)B(20 at. %) ferromagnetic single free layer 811 with thickness of 3 nm is deposited on the metallic Mg cap layer 810.

Also with reference to FIG. 8B, the first crystalline ferromagnetic Co(70 at. %)Fe(30 at. %) free layer 807-1', which is the preferred grain growth promotion seed layer, is deposited with thickness of 1.5 nm on the metallic Mg cap layer 810'. Then the second amorphous Co(60 at. %)Fe(20 at. %)B(20 at. %) ferromagnetic free layer 811' with thickness of 1.5 nm is deposited on the first crystalline ferromagnetic free layer 807-1'.

Figure 20A:
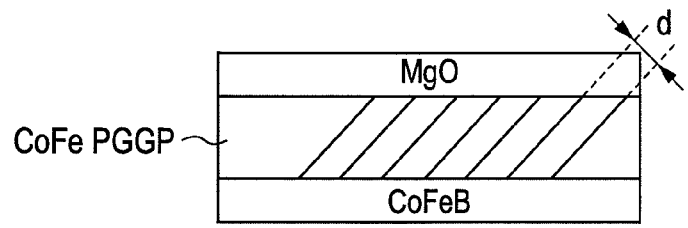
FIGS. 20A, 20B and 20C show the schematic diagrams to analyze the cross-section image obtained by high-resolution transmission electron microscope (HRTEM) and cross-section HRTEM images from as-grown MTJ of the second embodiment, respectively.
Figure 20B:
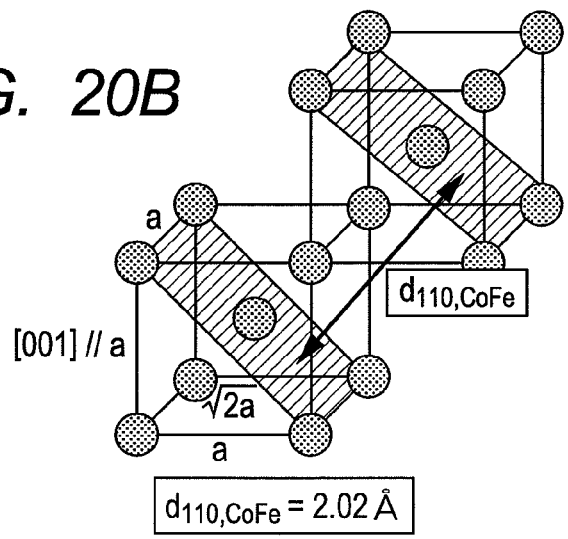
Figure 20C:
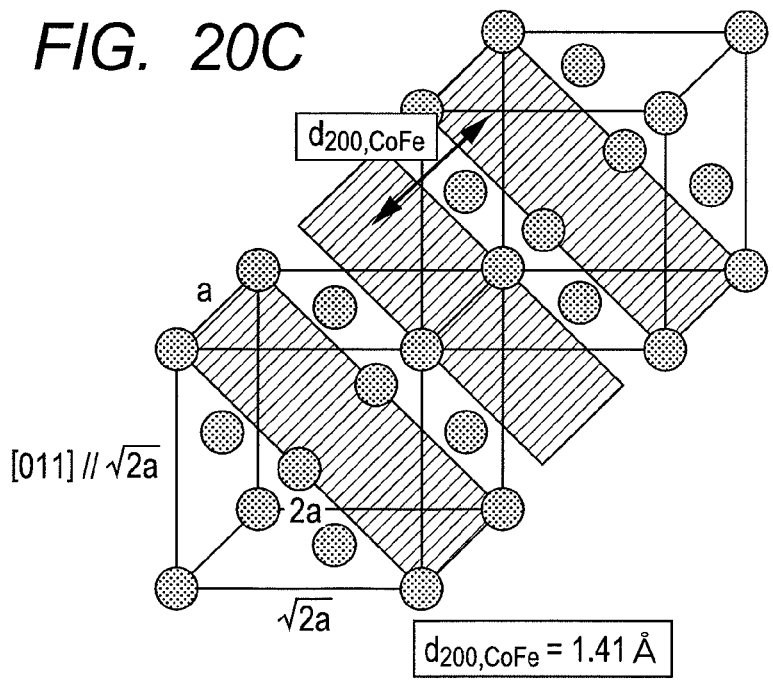
Figure 21:
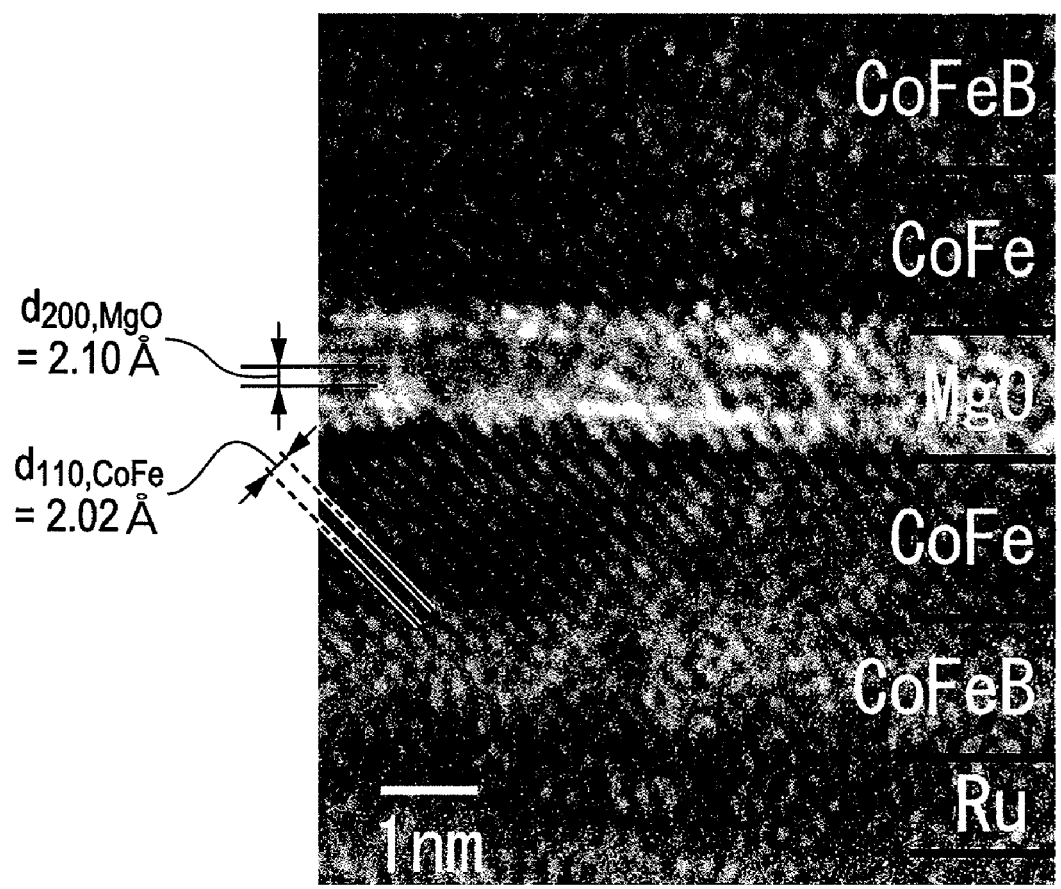
FIG. 21 is a photograph of overall crystallinity of the second CoFe ferromagnetic reference layer.

With reference to FIGS. 20A to 20C and FIG. 21, it is clear that the microstructure of the as-grown second CoFe ferromagnetic reference layer 807-2, 807-2', which is the preferred grain growth promotion seed layer, on the first amorphous CoFeB ferromagnetic reference layer 806, 806' is crystalline with body-centered-cubic structure and with (001) out-of-plane texture. FIGS. 20A to 20C show the method of analysis of cross-section image obtained by the high-resolution transmission electron microscope to confirm whether CoFe PGGP seed layer 807-2, 807-2' grows with (001) out-of-plane or (011) out-of-plane. Inter-atomic spacing (d) of CoFe PGGP seed layer 807-2, 807-2' sandwiched by the MgO tunnel barrier and the first amorphous CoFeB ferromagnetic reference layer 806, 806' in FIG. 20A is $d_{110}$ when the CoFe PGGP seed layer 807-2, 807-2' deposited on the first amorphous CoFeB ferromagnetic reference layer 806, 806' grows with (001) out-of-plane as shown in FIG. 20B, whereas the inter-atomic spacing (d) is $d_{200}$ when the CoFe PGGP seed layer 807-2, 807-2' deposited on the first amorphous CoFeB ferromagnetic reference layer 806, 806' grows with (011) out-of-plane as shown in FIG. 20C. Inter-atomic spacing of (110) atomic planes ($d_{110}$) of the CoFe with body-centered-cubic structure is 2.02 Å and $d_{200}$ is 1.41 Å. With respect to FIG. 21, overall crystallinity of the second CoFe ferromagnetic reference layer 807-2, 807-2', which is the preferred grain growth promotion seed layer, is confirmed. Inter-atomic spacing of CoFe PGGP seed layer 807-2, 807-2' is measured using $d_{111}$ of Cu layer as a reference, where $d_{111}$ is 2.08 Å, for the length reference (not shown here). Using this reference, the inter-atomic spacing of CoFe PGGP seed layer 807-2, 807-2' was measured by averaging 6 atomic planes, which provides the inter-atomic spacing is 2.02 Å. Therefore, it can be confirmed that the crystalline CoFe PGGP seed layer 807-2, 807-2' on the first amorphous CoFeB ferromagnetic reference layer 806, 806' grows with (001) out-of-plane. Furthermore, it also can be confirmed that the thickness of MgO tunnel barrier is 5 mono-layers, which is 10.5 Å correspondingly, and clear partition of the first amorphous CoFeB ferromagnetic reference layer 806, 806' and the second crystalline CoFe ferromagnetic reference layer 807-2, 807-2'.

Post-deposition magnetic field annealing is carried out at 360° C. for 2 hour under 10 kOe magnetic field. The purposed of post-deposition annealing is the crystallization of the first amorphous ferromagnetic reference layer 806, 806' and/or the second amorphous ferromagnetic free layer 811, 811' and the preferred grain growth of the said amorphous or microcrystalline MgO tunnel barrier with poor (001) out-of-plane texture. This crystallization and the preferred grain growth are realized using the second crystalline CoFe ferromagnetic reference layer 807-2, 807-2' and/or the first crystalline CoFe ferromagnetic free layer 807-1' as adjacent crystallization or preferred grain growth seed layer during annealing, thus eventually overall (001) out-of-plane texture of the ferromagnetic reference layer, MgO tunnel barrier and the ferromagnetic free layer.

Figure 22A:
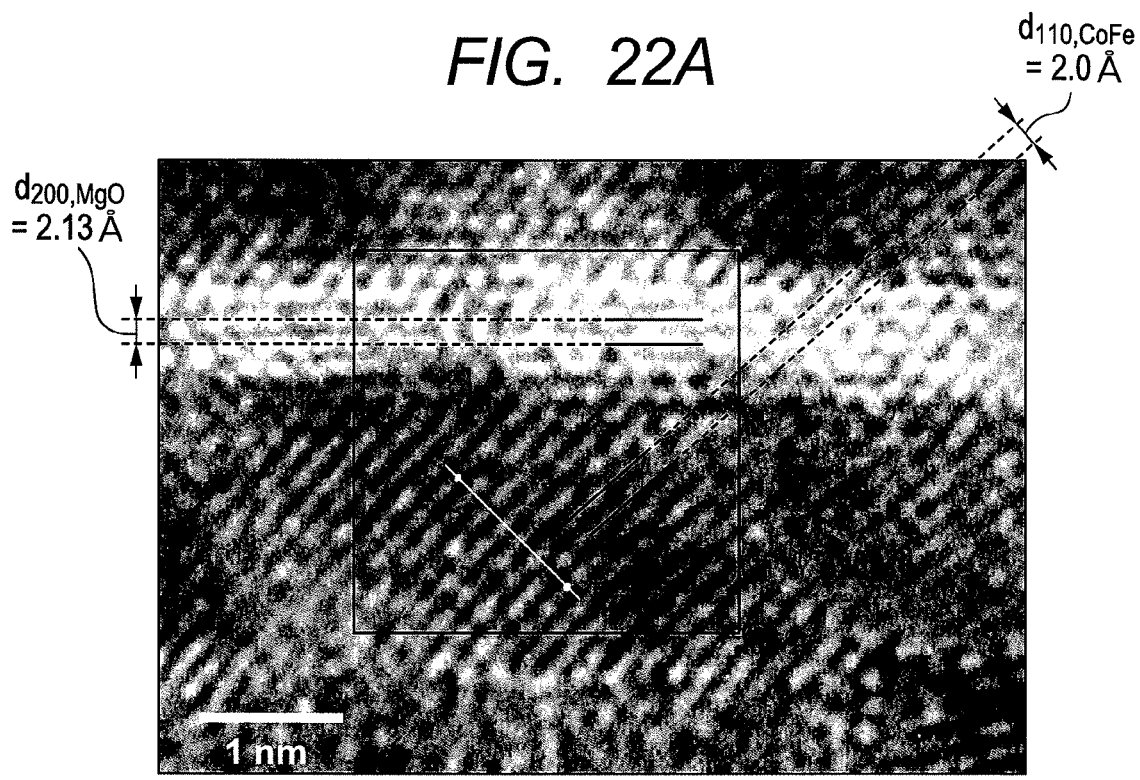
FIG. 22A is a photograph of cross-section HRTEM image from annealed MTJ of the second embodiment.
Figure 22B:
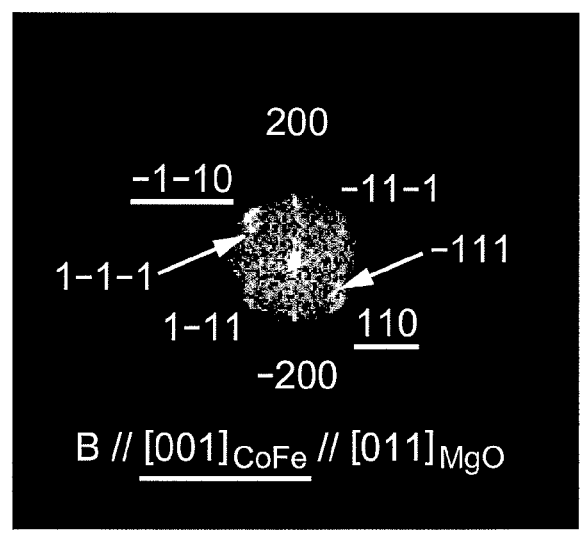
FIG. 22B is a photograph of the selected area diffraction patterns from the boxed-area of the HRTEM image.
Figure 23A:
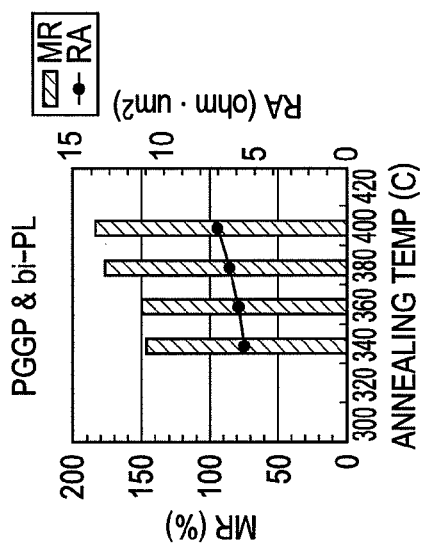
FIG. 23A to FIG. 23F are graphs which show the comparison of TMR, RA and Hey of magnetic tunnel junctions with different stack structure.
Figure 23B:
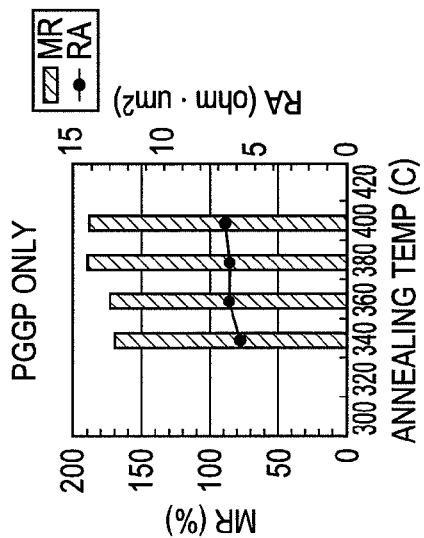
Figure 23C:
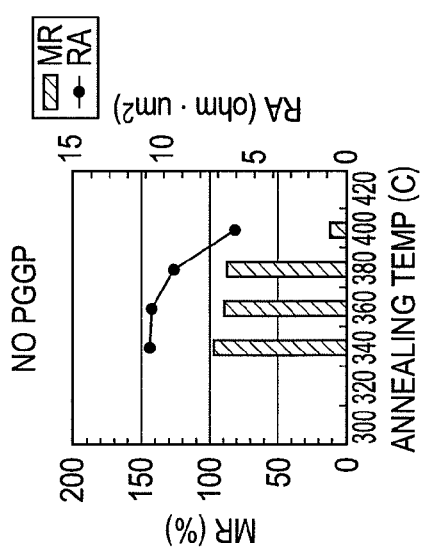
Figure 23D:
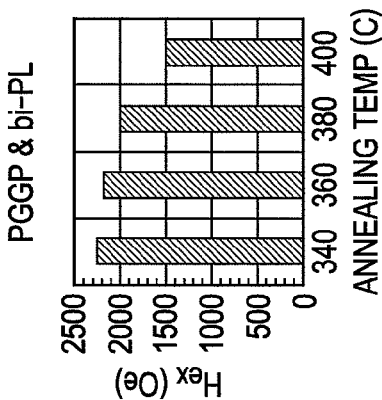
Figure 23E:
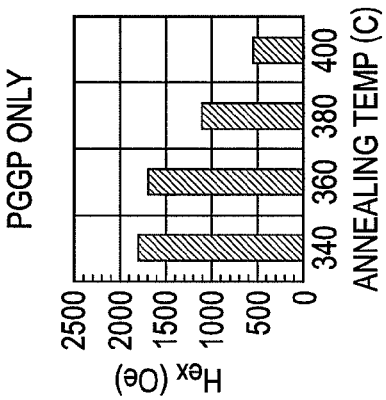
Figure 23F:
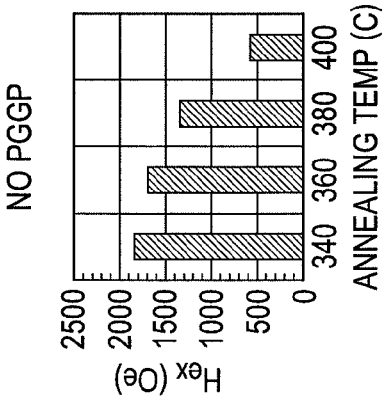

With reference to FIG. 22A and FIG. 22B, it is clear that the microstructure of the second CoFe ferromagnetic reference layer 807-2, 807-2', which is the preferred grain growth promotion seed layer, and the first CoFeB ferromagnetic reference layer 806, 806' form a single-layer-structured fully crystalline CoFe reference layer with body-centered-cubic structure and with (001) out-of-plane texture. The same argument to analyze the cross-section image (FIGS. 20A to 20C) obtained by the high-resolution transmission electron microscope is applied to confirm whether single-layer-structured CoFe reference layer after annealing is crystalline with (001) out-of-plane or (011) out-of-plane. With respect to FIG. 22A, the single-layered structure of reference layer is confirmed to be formed by merging the second CoFe ferromagnetic reference layer 807-2, 807-2', which is the preferred grain growth promotion seed layer, and the first CoFeB ferromagnetic reference layer 806, 806'. This formation of single-layer-structured reference layer is explained by the crystallization of the first CoFeB ferromagnetic reference layer 806, 806' based on the second CoFe ferromagnetic reference layer 807-2, 807-2' as the preferred grain growth promotion seed layer. Using the same length reference used in FIG. 21, the inter-atomic spacing of single-layer-structured CoFe reference layer after annealing was measured by averaging 7 atomic planes from the boxed-area in FIG. 22B, which provides the inter-atomic spacing is 2.0 Å. Also the inter-atomic spacing of MgO tunnel barrier was measured to be 2.13 Å by the length reference. Those inter-atomic spacings from the single-layer-structured CoFe reference layer and the MgO tunnel barrier after annealing confirm that both of MgO tunnel barrier and CoFe reference layer are fully crystalline with (001) out-of-plane texture. Furthermore, Selected-area diffraction pattern shown in FIG. 22B from boxed-area in FIG. 22A by fast Fourier transformation using Gatan Digitalmicrograph confirms the grain-to-grain pseudo-epitaxy, which is 45° rotational epitaxy, between the MgO tunnel barrier and the CoFe reference layer in that the [001] crystalline axis of single-layered CoFe reference layer is parallel to [011] crystalline axis of MgO tunnel barrier. Note that the diffraction patterns indexed with underline are from single-layer-structured CoFe reference layer and the diffraction patterns without underline are from MgO tunnel barrier. This grain-to-grain pseudo-epitaxy in CoFe/MgO/CoFe-based magnetic tunnel junction is critical prerequisite to obtain the giant TMR as explained by Choi et al. in J. Appl. Phys. 101, 013907 (2007).

Figure 10A:
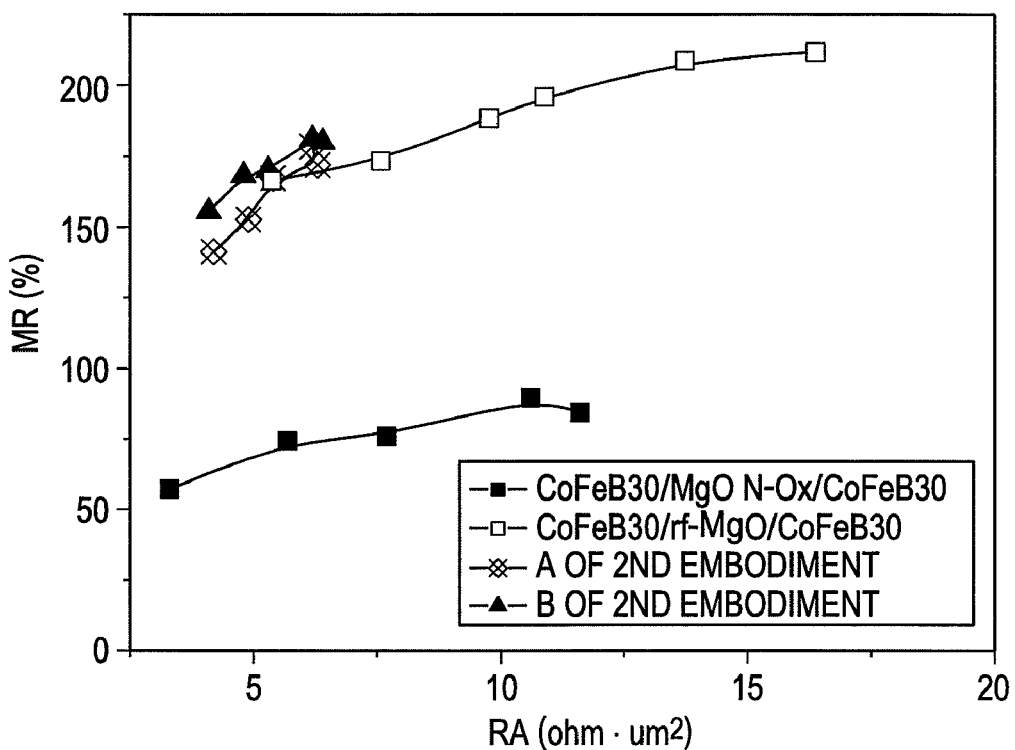
FIG. 10A shows the magnetotransport property comparison of A and B MTJ stacks of the second embodiment of the present invention compared to that of MTJs with MgO prepared by rf-sputtering and radical oxidation without PGGP seed layer and FIG. 10B shows MR ratio and R×A product comparison of A and B MTJ stacks of the second embodiment with respect to the reference identical MTJ stack only without PGGP seed layer.
Figure 10B:
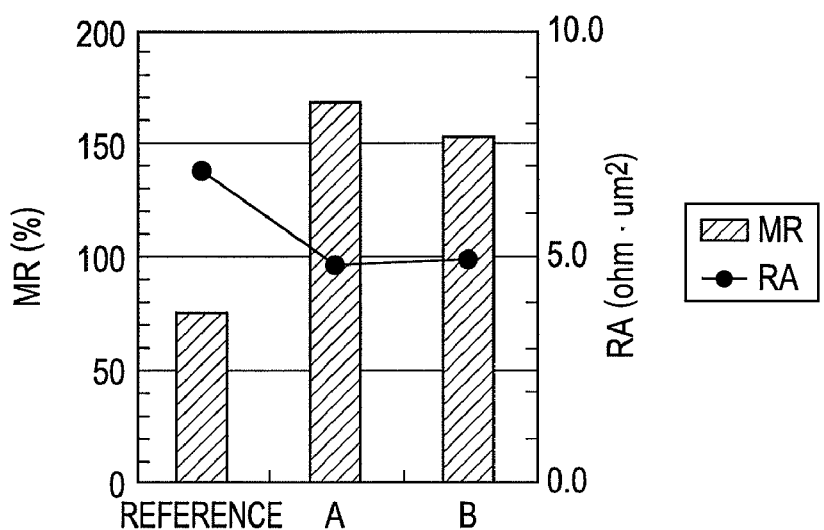

With reference to FIG. 10A and FIG. 10B, the magnetotransport properties of the MTJ prepared by the method of the present invention were measured using CIPT method. In order for comparison, the MTJ with MgO tunnel barrier prepared by rf sputtering and the MTJ with MgO tunnel barrier prepared by same oxidation method, in both of which crystalline CoFe PGGP seed layer is not employed, are shown as reference. As shown in FIG. 10A, with reference to the MR ratio and R×A product obtained from the MTJ with MgO prepared by same oxidation method but without the insertion of the crystalline PGGP seed layer, it is apparent that the MTJ which employs the crystalline PGGP layer shows much improved magnetotranport properties, in that noticeable increase of MR ratio is obtained with significant reduction of R×A product, which is comparable to or even better than those from MTJ with MgO tunnel barrier prepared by rf sputtering. At given R×A product of about 6 Ωµm², MTJ with MgO prepared by natural oxidation without the crystalline PGGP seed layer provides MR ratio of 74%, whereas the MTJs with MgO deposited by natural oxidation with the crystalline CoFe PGGP seed layer, A stack and B stack, provide 170% and 183%, respectively, which are comparable to or even higher than 170% obtained from the MTJ with MgO tunnel barrier prepared by rf sputtering without the crystalline PGGP seed layer. Clear evidence of R×A product reduction and MR ratio increase is shown in FIG. 10B. Only difference between reference and A and B is whether the MTJ employs the crystalline CoFe PGGP seed layer or not. The natural oxidation condition for all samples are identical; oxygen flow rate 700 sccm and exposure time 30 seconds. By use of the crystalline PGGP seed layer, R×A product drops from 7 $\Omega\mu m^2$ to 4.8 $\Omega\mu m^2$, which roughly drops by two thirds, and MR ratio increases from 74.4% to 169%.

Figure 11:
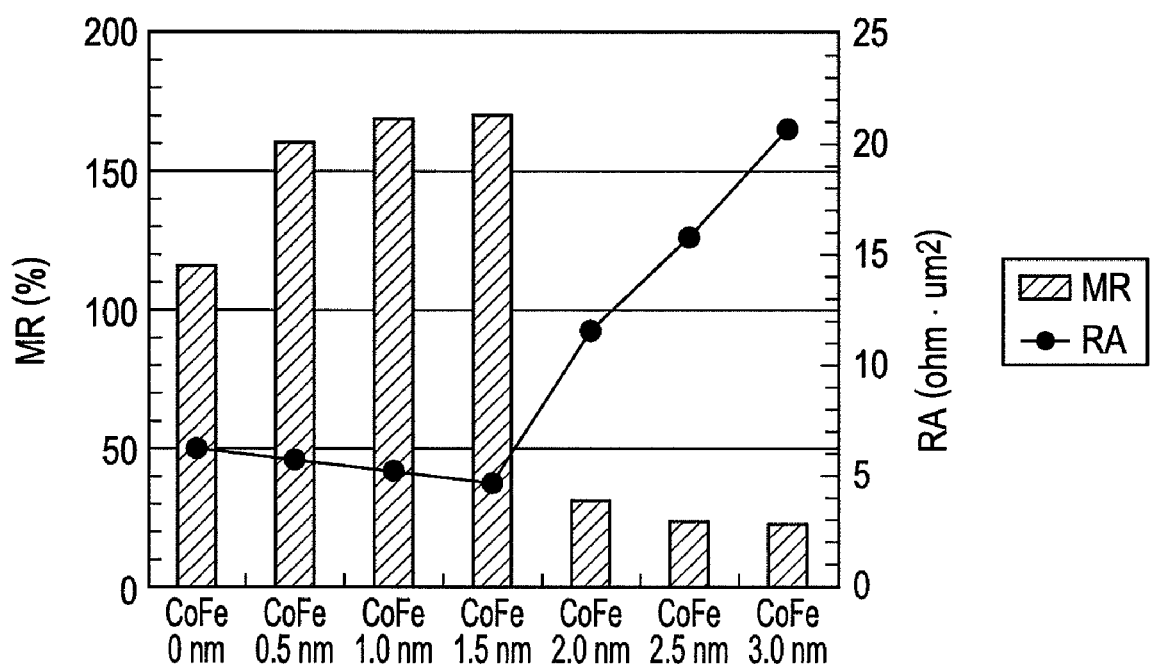
FIG. 11 shows MR ratio and R×A product comparison of A MTJ stack of the second embodiment, of which the thickness of the first amorphous CoFeB ferromagnetic reference layer is fixed at 1.5 nm, whereas the thickness of the second crystalline CoFe ferromagnetic reference layer, which is PGGP seed layer, varies.

Furthermore, another set of MTJs with A stack, of which thickness of the said second crystalline ferromagnetic CoFe reference layer varies, to optimize the thickness ratio between the first amorphous ferromagnetic CoFeB reference layer and the second crystalline CoFe reference layer in the bi-layer-structured ferromagnetic reference layer. Thickness of the first amorphous CoFeB ferromagnetic reference layer in the bi-layer-structured ferromagnetic reference layer is fixed at 1.5 nm. As shown in FIG. 11, it is clearly shown that MR ratio drops sharply and R×A product increases when the thickness of the second crystalline CoFe ferromagnetic reference layer is 2.0 nm and over. Thus it can be concluded that when the thickness of the first amorphous CoFeB ferromagnetic reference layer of the bi-layer-structured ferromagnetic reference layer is fixed at 1.5 nm, the thickness of the second crystalline CoFe ferromagnetic reference layer cannot exceed 1.5 nm to obtain higher MR ratio at lower R×A product.

Again, based on the previous studies correlating magnetotransport property and the crystallinity and pseudo-epitaxy in MTJ, it can be intuitively inferred that the insertion of the crystalline CoFe PGGP seed layer adjacent the MgO tunnel barrier, which is amorphous or microcrystalline with poor (001) out-of-plane texture, induces the crystallization and the preferred grain growth of the MgO tunnel barrier during the post-deposition annealing.

Third Embodiment

The third embodiment is a method of forming the tunnel barrier of MTJ devices by use of surfactant layer and followed by radical oxidation method and the employment of CoFe as the preferred grain growth promotion seed layer, in that the core element of the MTJ is formed by the combination of (a+e+i+k) of the group 1, 2, 3 and 4 mentioned above.

The following configuration of MTJ stack, as illustrated in FIG. 8C, is used in the third embodiment;
A stack (see FIG. 8C): Bottom layers (801")/PtMn15 (803")/CoFe2.5 (804")/Ru0.9 (805")/CoFeB1.5 (806")/<u>CoFe1.5 (807-2")</u>/Mg 0.43 (808")/Oxygen surfactant layer 30 Langmuir (814")/Mg 0.67 (815")/R—Ox x seconds (809")/Mg0.3 (810")/CoFeB3 (811")/Capping layers (812")/Top electrode (813"),
where unbracketed numbers are thickness in nanometer scale and the PGGP seed layer is indicated by underline.

Referring to FIG. 8C, one of important aspect of the third embodiment is the insertion of the preferred grain growth promotion (PGGP) seed layer, which is the second crystalline ferromagnetic reference layer 807-2", under the MgO tunnel barrier.

The first amorphous Co(60 at. %)Fe(20 at. %)B(20 at. %) ferromagnetic reference layer 806" with thickness of 1.5 nm is deposited on the non-magnetic Ru spacer layer 805". The second crystalline ferromagnetic Co(70 at. %)Fe(30 at. %) reference layer 807-2", which is the preferred grain growth promotion seed layer, is deposited with thickness of 1.5 nm on the first amorphous ferromagnetic reference layer 806".

The method of forming the MgO tunnel barrier is as follows;
deposition of first metallic Mg layer 808" on the second crystalline ferromagnetic reference layer 807-2", which is the preferred grain growth promotion seed layer, with thickness of 0.43 nm,
formation of the oxygen surfactant layer 814" within the vacuum chamber by exposing the 0.43 nm of metallic Mg layer 808" to the oxygen ambience, wherein the exposure is controlled to be 30 Langmuir by the exposure time and the oxygen flow through the chamber,
deposition of second metallic Mg layer 815" on the oxygen surfactant layer with thickness of 0.67 nm, oxidation of the first and second metallic layers 808" and 815" by radical oxidation carried out in the oxidation chamber, in which electrically-ground "shower plate" is placed between an upper ionizing electrode and the substrate. Oxygen plasma is generated by applying 300 W of rf power to the ionizing electrode with oxygen flow of 700 sccm. Oxygen radical shower flows through the shower plate, whereas particles with electric charge, such as ionized species and electrons, cannot pass through due to the electric grounding of shower plate, and
deposition of the metallic Mg cap layer 810" with thickness of 0.3 nm on the first and the second metallic Mg layers 808" and 815" oxidized by radical oxidation.

With reference to FIG. 8C, the amorphous Co(60 at. %)Fe (20 at. %)B(20 at. %) ferromagnetic single free layer 811" with thickness of 3 nm is deposited on the metallic Mg cap layer 810".

Post-deposition magnetic field annealing is carried out at 360° C. for 2 hour under 10 kOe magnetic field. The purposed of post-deposition annealing is the crystallization of the first amorphous ferromagnetic reference layer 806" and the amorphous ferromagnetic free layer 811" and the preferred grain growth of the said amorphous or microcrystalline MgO tunnel barrier with poor (001) out-of-plane texture. This crystallization and the preferred grain growth are realized using the second crystalline CoFe ferromagnetic reference layer as adjacent crystallization or preferred grain growth seed layer during annealing, thus eventually overall (001) out-of-plane texture of the ferromagnetic reference layer, MgO tunnel barrier and the ferromagnetic free layer.

Figure 12:
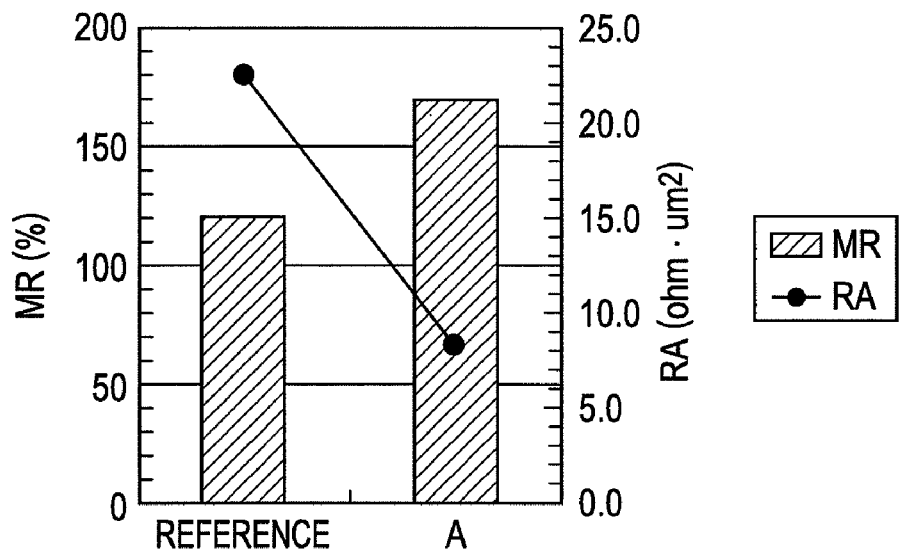
FIG. 12 shows MR ratio and R×A product comparison of A MTJ stack of the third embodiment with respect to the reference identical MTJ stack only without PGGP seed layer.

With reference to FIG. 12, clear evidence of R×A product reduction and MR ratio increase is confirmed. Only difference between reference and A is whether the MTJ employs the crystalline PGGP seed layer or not. The radical oxidation condition for all samples are identical; 300 W, 700 sccm and 10 seconds. By use of the crystalline PGGP seed layer, R×A product drops from 22.5 $\Omega\mu m^2$ to 8.3 $\Omega\mu m^2$, which roughly drops by a third, and MR ratio increases from 120% to 170%.

Again, based on the previous studies correlating magnetotransport property and the crystallinity and pseudo-epitaxy in MTJ, it can be intuitively inferred that the insertion of the crystalline CoFe PGGP seed layer adjacent the MgO tunnel barrier, which is amorphous or microcrystalline with poor (001) out-of-plane texture, induces the crystallization and the preferred grain growth of the MgO tunnel barrier during the post-deposition annealing.

Forth Embodiment

The forth embodiment is a method of forming the tunnel barrier of MTJ devices by reactive sputtering and the employment of CoFe as the preferred grain growth promotion seed layer, in that the core element of the MTJ is formed by the combination of (a+h+i+k) of the group 1, 2, 3 and 4 mentioned above.

The following configuration of MTJ stacks, as illustrated in FIG. 8D, is used in the forth embodiment;
A stack: Bottom layers (801''' and 802''')/PtMn15 (803''')/CoFe2.5 (804''')/Ru0.9 (805''')/CoFeB1.5 (806''')/<u>CoFe1.5 (807-2''')</u>/Mg 0.6 (808''')/MgOx reactive sputtering 0.6

(816''')/N—Ox x seconds (809''')/Mg 0.35 (810''')/CoFeB3 (811''')/Capping layers (812''')/Top electrode (813'''), where unbracketed numbers are thickness in nanometer scale and the PGGP seed layer is indicated by underline.

Referring to FIG. 8D, one of important aspect of the forth embodiment is the insertion of the preferred grain growth promotion seed layer, which is the second crystalline CoFe ferromagnetic reference layer 807-2''', under the MgO tunnel barrier.

The first amorphous Co(60 at. %)Fe(20 at. %)B(20 at. %) ferromagnetic reference layer 806''' with thickness of 1.5 nm is deposited on the non-magnetic Ru spacer layer 805'''. The second crystalline ferromagnetic Co(70 at. %)Fe(30 at. %) reference layer 807-2''', which is the preferred grain growth promotion seed layer, is deposited with thickness of 1.5 nm on the first amorphous ferromagnetic reference layer 806'''.

The method of forming the MgO tunnel barrier is as follows;
deposition of first metallic Mg layer 808''' on the second crystalline ferromagnetic reference layer 807-2''', which is the preferred grain growth promotion seed layer, with thickness of 0.6 nm,
formation of MgO layer 816''' through the reactive sputtering of Mg in the mixed gas of argon and oxygen by flowing argon at the flow rate of 40 sccm and the oxygen at the flow rate of 4 sccm with thickness of 0.6 nm on the first metallic Mg layer 808'''.
oxidation of the first metallic layer 808''' and the MgO layer 810''' by natural oxidation carried out in the oxidation chamber. The natural oxidation process, which is advantageously applied to the thinly formed metallic Mg layer and the MgO layer, requires purging the oxidation chamber with oxygen gas at a pressure of approximately $6.5 \times 10^{-1}$ Pa and flowing the oxygen gas at the flow rate of 700 sccm, then leaving the as-deposited metallic Mg layer and the MgO layer in contact with the oxygen gas flow for given exposure time, and deposition of the metallic Mg cap layer 810''' with thickness of 0.3 nm on the MgO layer and the first metallic Mg layer oxidized by natural oxidation.

With reference to FIG. 8D, the amorphous Co(60 at. %)Fe (20 at. %)B(20 at. %) ferromagnetic single free layer 811''' with thickness of 3 nm is deposited on the metallic Mg cap layer 810'''.

Post-deposition magnetic field annealing is carried out at 360° C. for 2 hour under 10 kOe magnetic field. The purposed of post-deposition annealing is the crystallization of the first amorphous ferromagnetic reference layer 806''' and the amorphous ferromagnetic free layer 811''' and the preferred grain growth of the said amorphous or microcrystalline MgO tunnel barrier with poor (001) out-of-plane texture. This crystallization and the preferred grain growth are realized using the second crystalline ferromagnetic reference layer 807-2''' as adjacent crystallization or preferred grain growth seed layer during annealing, thus eventually overall (001) out-of-plane texture of the ferromagnetic reference layer, MgO tunnel barrier and the ferromagnetic free layer.

Figure 13:
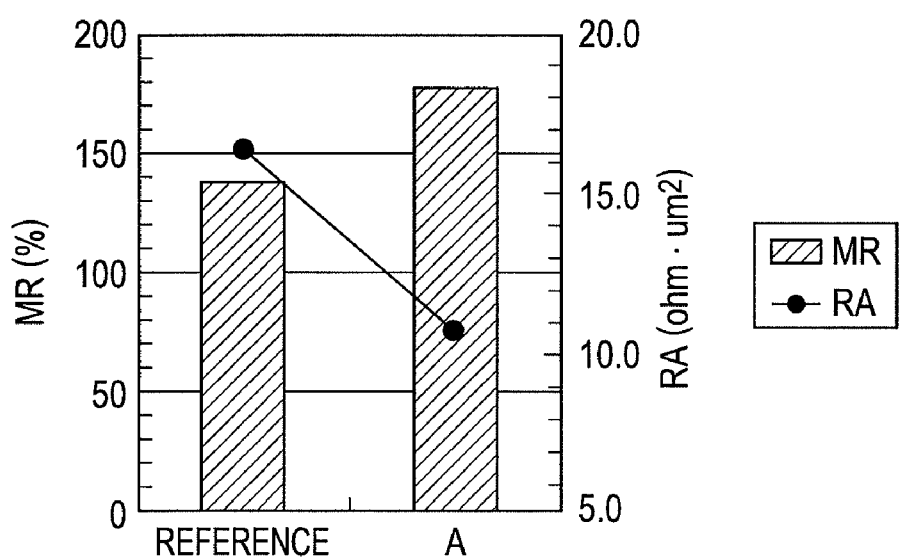
FIG. 13 shows MR ratio and R×A product comparison of A MTJ stack of the forth embodiment with respect to the reference identical MTJ stack only without PGGP seed layer.

With reference to FIG. 13, clear evidence of R×A product reduction and MR ratio increase is confirmed. Only difference between reference and A is whether the MTJ employs the crystalline CoFe PGGP seed layer or not. The natural oxidation condition for all samples are identical; oxygen flow rate 700 sccm and exposure time 30 seconds. By use of the crystalline PGGP seed layer, R×A product drops from 16.5 Ωμm² to 10.2 Ωμm² and MR ratio increases from 135% to 185%.

Again, based on the previous studies correlating magnetotransport property and the crystallinity and pseudo-epitaxy in MTJ, it can be intuitively inferred that the insertion of the crystalline CoFe PGGP seed layer adjacent the MgO tunnel barrier, which is amorphous or microcrystalline with poor (001) out-of-plane texture, induces the crystallization and the preferred grain growth of the MgO tunnel barrier during the post-deposition annealing.

Fifth Embodiment

The fifth embodiment is a method of forming the tunnel barrier of MTJ devices by natural oxidation method and the employment of CoFeB as the crystalline preferred grain growth promotion seed layer, in that the core element of the MTJ is formed by the combination of (b+d+j+k) of the group 1, 2, 3 and 4 mentioned above.

Figure 14:
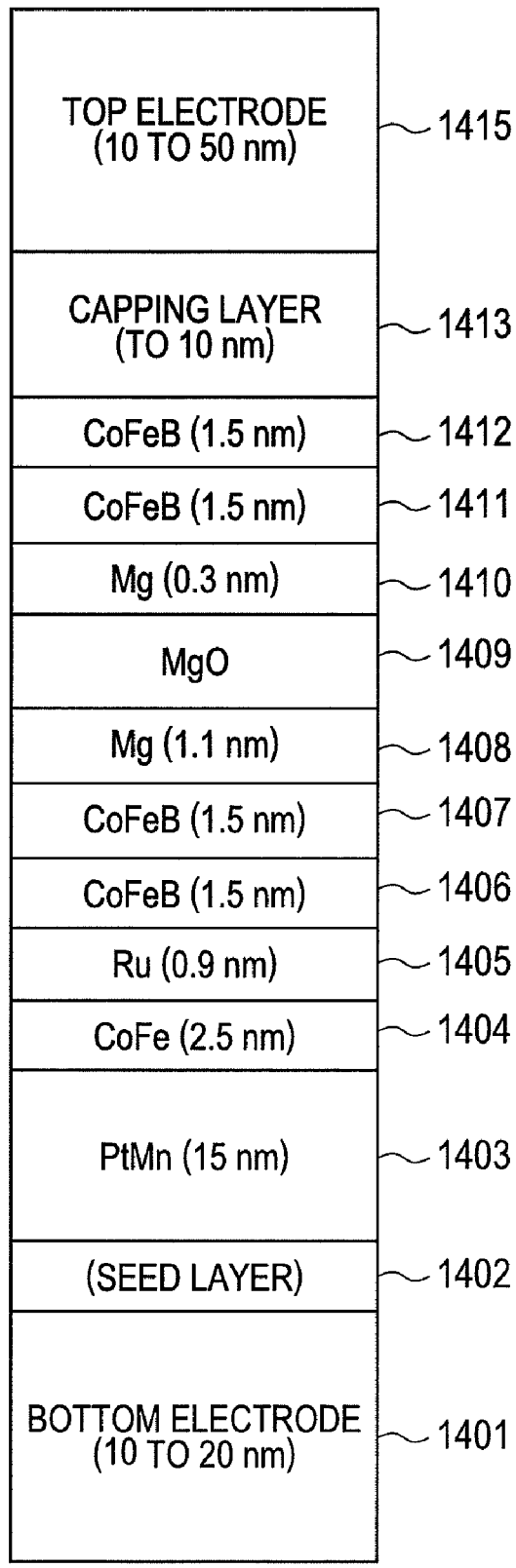
FIG. 14 shows schematic of MTJ of the fifth embodiment in the present invention with CoFeB PGGP seed layer in both of reference layer and free layer.

Two identical configurations of MTJ stacks, as illustrated in FIG. 14, are used in the fifth embodiment with different boron content in the CoFeB PGGP seed layer as follows;
A stack: Bottom layers (1401, 1402)/PtMn15 (1403)/CoFe2.5 (1404)/Ru0.9 (1405)/CoFeB1.5 (1406)/CoFeB (Boron 2.9 atomic %) 1.5 (1407)/Mg1.1 (1408)/N—Ox x seconds (1409)/Mg0.3 (1410)/CoFeB (Boron 2.9 atomic %) 1.5 (1411)/CoFeB1.5 (1412)/Capping layers (1413)/Top electrode (1415),
B stack: Bottom layers (1401, 1402)/PtMn15 (1403)/CoFe2.5 (1404)/Ru0.9 (1405)/CoFeB1.5 (1406)/CoFeB (Boron 5.1 atomic %) 1.5 (1407)/Mg1.1 (1408)/N—Ox x seconds (1409)/Mg0.3 (1410)/CoFeB (Boron 5.1 atomic %)1.5 (1411)/CoFeB1.5 (1412)/Capping layers (1413)/Top electrode (1415),
where unbracketed numbers are thickness in nanometer scale and the PGGP seed layers are indicated by underline.

Referring to FIG. 14, one of important aspect of the fifth embodiment is the insertion of the preferred grain growth promotion seed layers, which are the second crystalline ferromagnetic reference layer and the first crystalline ferromagnetic free layer, sandwiching the MgO tunnel barrier.

Figures 15A, 15B:
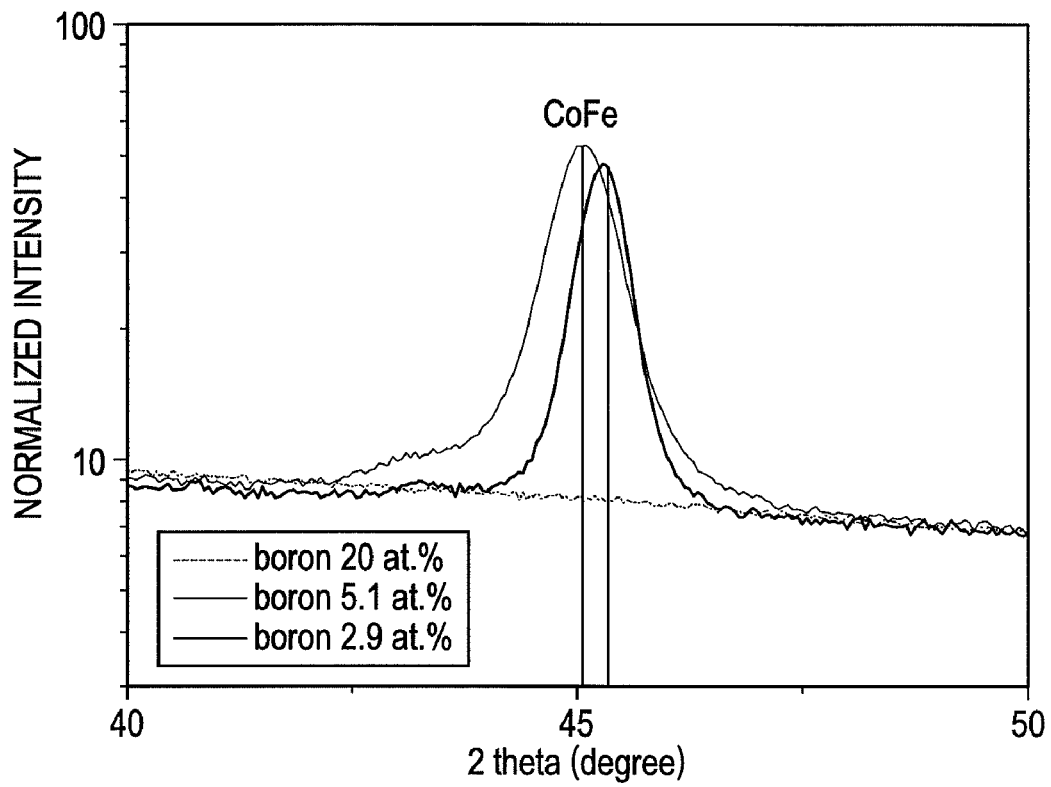
FIG. 15A and FIG. 15B show the XRD theta-2 theta scan obtained from CoFeB single layers, whose boron contents are 20 atomic %, 5.1 atomic % and 2.9 atomic %. Peak position, full width at half maximum and the resistivity from each of single layers are shown in the table.

With respect to FIG. 15A and FIG. 15B, it is clear that the microstructure of CoFeB with boron content of 5.1 atomic % and 2.9 atomic % is crystalline in as-deposited state, whereas that of CoFeB with boron content of 20 atomic % is amorphous, which is confirmed by xRD theta–2 theta scan from the CoFeB single layer deposited on the thermally oxidized Si wafer. Intensity is normalized by thickness of CoFeB single film. Calculated grain size using Sherrer formula shows that the grain size of CoFeB (B: 2.9 atomic %) is larger than that of CoFeB (B: 5.1 atomic %), which can be reassured by the significant reduction of resistivity. Resistivity of the CoFeB changes noticeably with its crystallinity corresponding to its boron contents. Furthermore, the shift of the XRD peak from 45.35° of CoFeB (B: 2.9 atomic %) to 45.02° of CoFeB (B: 5.1 atomic %) indicates the lattice expansion of CoFe with its inclusion of boron at the interstitial sites of body-centered-cubic structure.

The first amorphous Co(60 at. %)Fe(20 at. %)B(20 at. %) ferromagnetic reference layer with thickness of 1.5 nm is deposited on the non-magnetic Ru spacer layer.

The second crystalline ferromagnetic reference layer in the stack A of the fifth embodiment, which is the preferred grain growth promotion seed layer, is deposited by co-sputtering of Co(70 at. %)Fe(30 at. %) target and Co(60 at. %)Fe(20 at. %)B(20 at. %) target and the composition ratio is controlled by the manipulation of the power ratio of co-sputtering. The composition of the second crystalline ferromagnetic reference layer, which is the PGGP seed layer, is Co(69.9 at. %)Fe(27.2 at. %)B(2.9 at. %) with thickness of 1.5 nm on the first amorphous ferromagnetic reference layer. With reference to FIG. 15A and FIG. 15B, it is confirmed that the as-grown state of Co(69.9 at. %)Fe(27.2 at. %)B(2.9 at. %) layer is crystalline. Also the crystallinity of Co(69.9 at. %)Fe (27.2 at. %)B(2.9 at. %) is confirmed by the reduction of resistivity to 20.6 μΩ-cm from 111 μΩ-cm of Co(60 at. %)Fe (20 at. %)B(20 at. %) due to the better crystallinity compared to the amorphous phase.

The second crystalline ferromagnetic reference layer in the stack B of the fifth embodiment, which is the preferred grain growth promotion seed layer, is deposited by co-sputtering of Co(70 at. %)Fe(30 at. %) target and Co(60 at. %)Fe(20 at. %) B(20 at. %) target and the composition ratio is controlled by the manipulation of the power ratio of co-sputtering. The composition of the second crystalline ferromagnetic reference layer, which is the PGGP seed layer, is Co(69.3 at. %) Fe(25.6 at. %)B(5.1 at. %) with thickness of 1.5 nm on the first amorphous ferromagnetic reference layer. With reference to FIG. 15, it is confirmed that the as-grown state of Co(69.3 at. %)Fe(25.6 at. %)B(5.1 at. %) layer is crystalline. Also the crystallinity of Co(69.3 at. %)Fe(25.6 at. %) B(5.1 at. %) is confirmed by the reduction of resistivity to 43.2 pΩ-cm from 111 μΩ-cm of Co(60 at. %)Fe(20 at. %)B (20 at. %) due to the better crystallinity compared to the amorphous phase.

The method of forming the MgO tunnel barrier is as follows;

deposition of first metallic Mg layer on the second crystalline ferromagnetic reference layer, which is the preferred grain growth promotion seed layer, with thickness of 1.1 nm, oxidation of the first metallic layer by natural oxidation carried out in the oxidation chamber. The natural oxidation process, which is advantageously applied to the thinly formed metallic Mg layer, requires purging the oxidation chamber with oxygen gas at a pressure of approximately $6.5 \times 10^{-1}$ Pa and flowing the oxygen gas at the flow rate of 700 sccm, then leaving the as-deposited metallic Mg layer in contact with the oxygen gas flow for given exposure time, and deposition of the metallic Mg cap layer with thickness of 0.3 nm on the first metallic Mg layer oxidized by natural oxidation.

The first crystalline ferromagnetic free layer in the stack A of the fifth embodiment, which is the preferred grain growth promotion seed layer, is deposited by co-sputtering of Co(70 at. %)Fe(30 at. %) target and Co(60 at. %)Fe(20 at. %)B(20 at. %) target and the composition ratio is controlled by the manipulation of the power ratio of co-sputtering. The composition of the second crystalline ferromagnetic reference layer, which is the PGGP seed layer, is Co(69.9 at. %)Fe(27.2 at. %)B(2.9 at. %) with thickness of 1.5 nm on the metallic Mg cap layer.

The first crystalline ferromagnetic free layer in the stack B of the fifth embodiment, which is the preferred grain growth promotion seed layer, is deposited by co-sputtering of Co(70 at. %)Fe(30 at. %) target and Co(60 at. %)Fe(20 at. %)B(20 at. %) target and the composition ratio is controlled by the manipulation of the power ratio of co-sputtering. The composition of the second crystalline ferromagnetic reference layer, which is the PGGP seed layer, is Co(69.3 at. %)Fe(25.6 at. %)B(5.1 at. %) with thickness of 1.5 nm on the metallic Mg cap layer.

Then the second amorphous Co(60 at. %)Fe(20 at. %)B(20 at. %) ferromagnetic free layer with thickness of 1.5 nm is deposited on the first crystalline ferromagnetic free layer, which is the preferred grain growth promotion seed layer.

Post-deposition magnetic field annealing is carried out at 360° C. for 2 hour under 10 kOe magnetic field. The purposed of post-deposition annealing is the crystallization of the first amorphous ferromagnetic reference layer and/or the second amorphous ferromagnetic free layer and the preferred grain growth of the said amorphous or microcrystalline MgO tunnel barrier with poor (001) out-of-plane texture. This crystallization and the preferred grain growth are realized using the second crystalline ferromagnetic reference layer and/or the first crystalline ferromagnetic free layer as adjacent crystallization or preferred grain growth seed layer during annealing, thus eventually overall (001) out-of-plane texture of the ferromagnetic reference layer, MgO tunnel barrier and the ferromagnetic free layer.

Figure 16A:
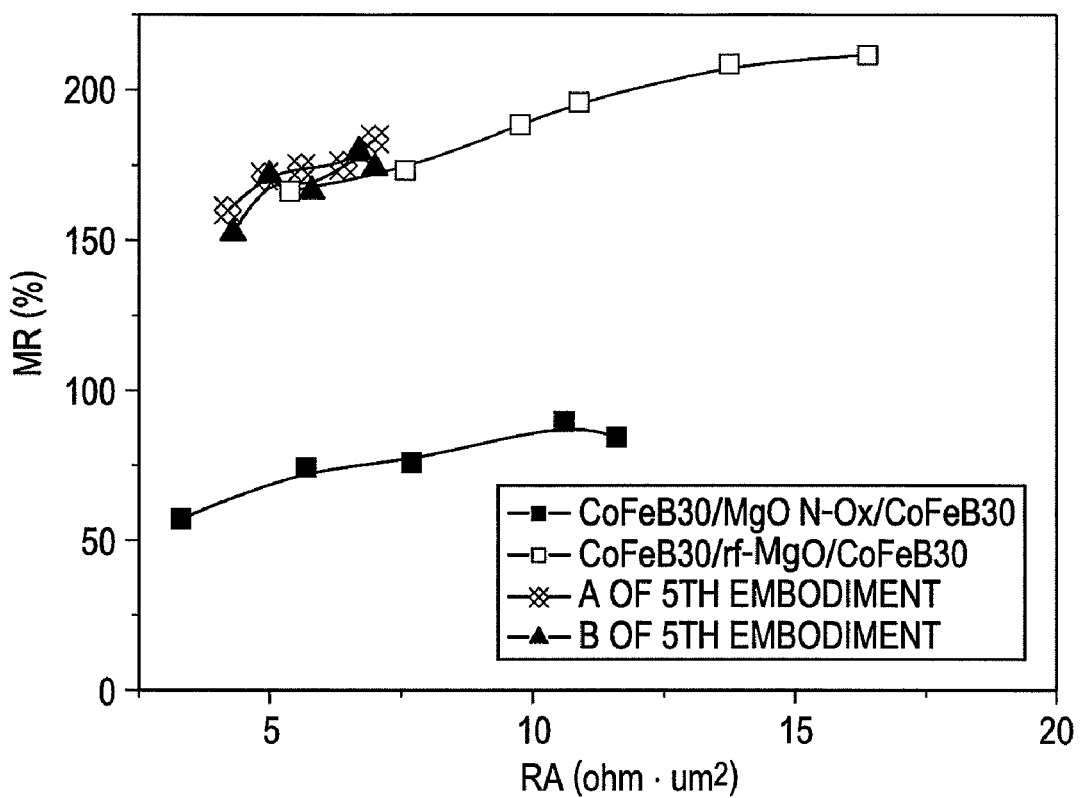
FIG. 16A shows the magnetotransport property comparison of A and B MTJ stacks of the fifth embodiment of the present invention compared to that of MTJs with MgO prepared by rf-sputtering and radical oxidation without PGGP seed layer.
Figure 16B:
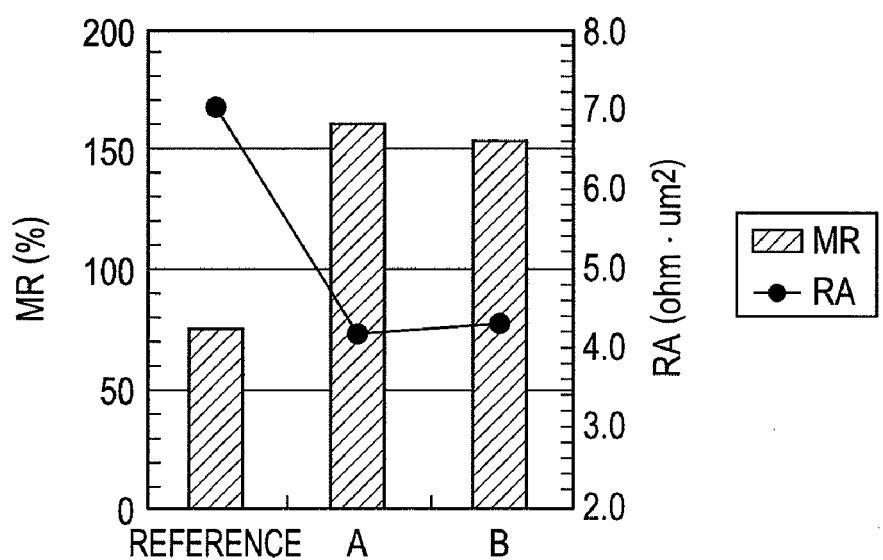
FIG. 16B shows MR ratio and R×A product comparison of A and B MTJ stacks of the second embodiment with respect to the reference identical MTJ stack only without PGGP seed layer.

With reference to FIG. 16A and FIG. 16B, the magnetotransport properties of the MTJ prepared by the method of the present invention were measured using CIPT method. In order for comparison, the MTJ with MgO tunnel barrier prepared by rf sputtering and the MTJ with MgO tunnel barrier prepared by same oxidation method, in both of which crystalline PGGP seed layer is not employed, are shown as reference. As shown in FIG. 16A, with reference to the MR ratio and R×A product obtained from the MTJ with MgO prepared by same oxidation method but without the insertion of the crystalline PGGP seed layer, it is apparent that the MTJ employs the crystalline CoFeB PGGP layer shows much improved magnetotranport properties, in that noticeable increase of MR ratio is obtained with significant reduction of R×A product, which is comparable to or even better than those from MTJ with MgO tunnel barrier prepared by rf sputtering. At given R×A product of about 6 Ωμm$^2$, MTJ with MgO prepared by natural oxidation without the crystalline PGGP seed layer provides MR ratio of 74%, whereas the MTJs with MgO deposited by natural oxidation with the crystalline CoFeB PGGP seed layer, A stack and B stack, provide 178% and 170%, respectively, which are comparable to or even higher than 170% obtained from the MTJ with MgO tunnel barrier prepared by rf sputtering without the crystalline PGGP seed layer. Clear evidence of R×A product reduction and MR ratio increase is shown in FIG. 16B. Only difference between reference and A and B is whether the MTJ employs the crystalline PGGP seed layer or not. The natural oxidation condition for all samples is identical; oxygen flow rate 700 sccm and exposure time 30 seconds. By use of the crystalline PGGP seed layer, R×A product drops from 7 Ωμm$^2$ to 4.2 Ωμm$^2$ and MR ratio increases from 74.4% to 160%.

Again, based on the previous studies correlating magnetotransport property and the crystallinity and pseudo-epitaxy in MTJ, it can be intuitively inferred that the insertion of the crystalline PGGP seed layer adjacent the MgO tunnel barrier, which is amorphous or microcrystalline with poor (001) out-of-plane texture, induces the crystallization and the preferred grain growth of the MgO tunnel barrier during the post-deposition annealing.

Sixth Embodiment

The sixth embodiment is a method of forming the tunnel barrier of MTJ devices by natural oxidation method and the employment of Fe as the crystalline preferred grain growth promotion seed layer, in that the core element of the MTJ can be formed by the combination of (c+d+j+k) of the group 1, 2, 3 and 4 mentioned above.

Figure 17:
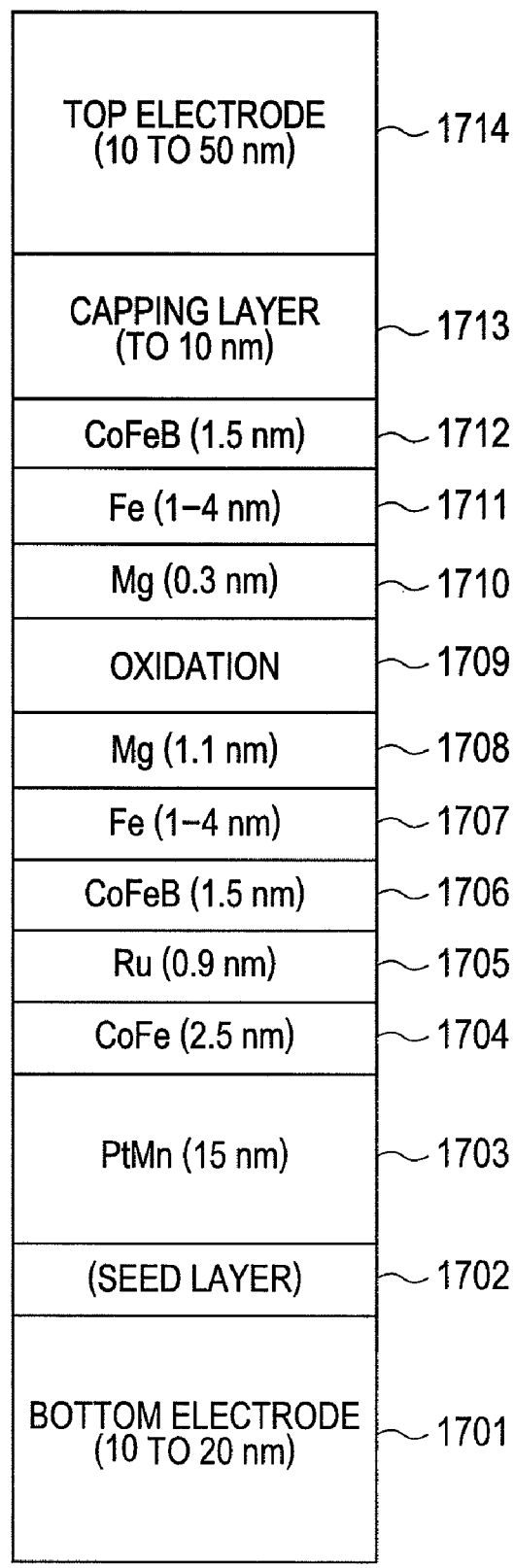
FIG. 17 shows schematic of MTJ of the sixth embodiment in the present invention with Fe PGGP seed layer in both of reference layer and free layer.

The following configuration of MTJ stack, as illustrated in FIG. 17, can be used in the sixth embodiment;

A stack: Bottom layers (1701, 1702)/PtMn15 (1703)/ CoFe2.5 (1704)/Ru0.9 (1705)/CoFeB1.5 (1706)/Fe x (1707)/ Mg1.1 (1708)/N—Ox x seconds (1709)/Mg0.3 (1710)/Fe x (1711)/CoFeB1.5 (1712)/Capping layers (1713)/Top electrode (1714), where unbracked numbers are thickness in nanometer scale and the PGGP seed layers are indicated by underline.

Referring to FIG. 17, one of important aspect of the sixth embodiment is the insertion of the preferred grain growth promotion seed layer, which is the second crystalline ferromagnetic Fe reference layer 1707 and the first crystalline ferromagnetic Fe free layer 1711, sandwiching the MgO tunnel barrier (1708, 1709, 1710).

The first amorphous Co(60 at. %)Fe(20 at. %)B(20 at. %) ferromagnetic reference layer 1706 with thickness of 1-4 nm is deposited on the non-magnetic Ru spacer layer 1705.

The second crystalline ferromagnetic Fe reference layer 1707 in the stack A of the sixth embodiment, which is the preferred grain growth promotion seed layer, is deposited with thickness of 0.5-2 nm on the first amorphous ferromagnetic reference layer 1706.

The method of forming the MgO tunnel barrier is as follows;
deposition of first metallic Mg layer 1708 on the second crystalline ferromagnetic reference layer 1707, which is the preferred grain growth promotion seed layer, with thickness of 1.1 nm,
oxidation of the first metallic layer 1708 by natural oxidation carried out in the oxidation chamber. The natural oxidation process, which is advantageously applied to the thinly formed metallic Mg layer, requires purging the oxidation chamber with oxygen gas and flowing the oxygen gas, then leaving the as-deposited metallic Mg layer in contact with the oxygen gas flow for given exposure time, and deposition of the metallic Mg cap 1710 layer with thickness of 0.3 nm on the first metallic Mg layer 1709 oxidized by natural oxidation.

The first crystalline ferromagnetic Fe free layer 1711 in the stack A of the sixth embodiment, which is the preferred grain growth promotion seed layer, is deposited with thickness of 0.5-2 nm on the metallic Mg cap layer 1710.

Then the second amorphous Co(60 at. %)Fe(20 at. %)B(20 at. %) ferromagnetic free layer 1712 with thickness of 1-4 nm is deposited on the first crystalline ferromagnetic free layer 1711, which is the preferred grain growth promotion seed layer.

Seventh Embodiment

The seventh embodiment is a method of forming the tunnel barrier of MTJ devices by natural oxidation method and the employment of CoFe as the preferred grain growth promotion seed layer and also the employment of bi-layer structured pinned layer, in that the core element of the MTJ is formed by the combination of (a+d+i+l) or (a+d+j+l) of the group 1, 2, 3 and 4 mentioned above.

Figure 18:
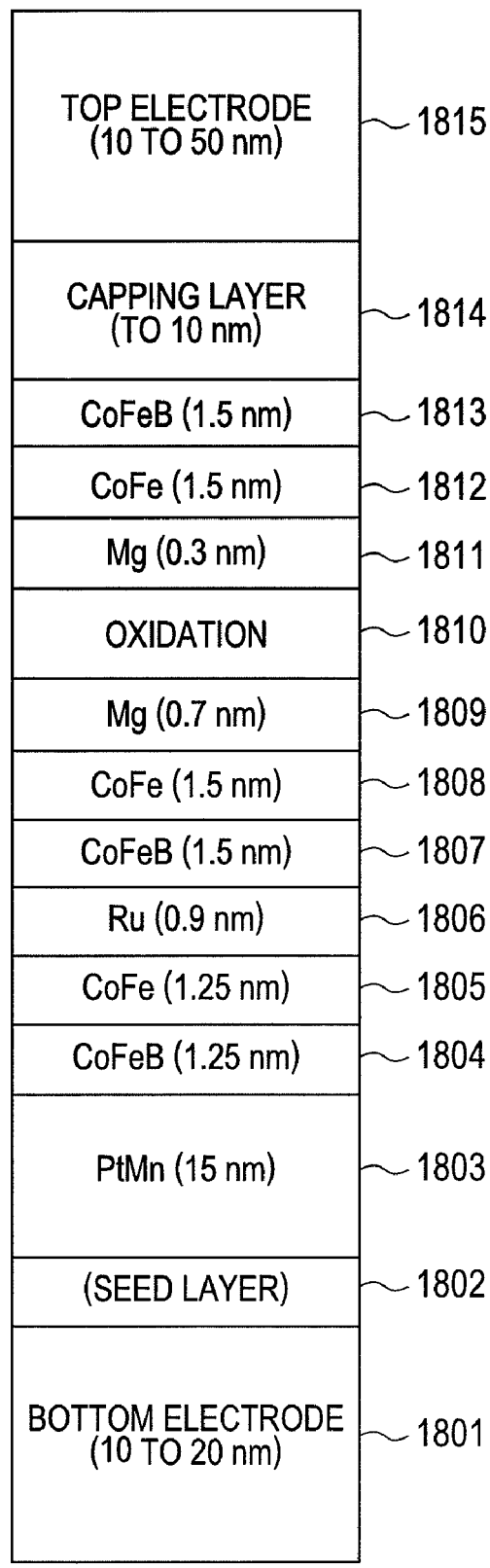
FIG. 18 shows schematic of MTJ of the seventh embodiment in the present invention with CoFe PGGP seed layer in both of reference layer and free layer. Also bi-layer structured ferromagnetic pinned layer is employed.

The configuration of MTJ stacks, as illustrated in FIG. 18, is used in the seventh embodiment as follows;
A stack: Bottom layers (1801, 1802)/PtMn15 (1803)/CoFeB1.25 (1804)/Co<u>Fe1.25</u> (1805)/Ru0.9 (1806)/CoFeB1.5 (1807)/Co<u>Fe1.5</u> (1808)/Mg0.7 (1809)/N—Ox x seconds (1810)/Mg0.3 (1811)/Co<u>Fe1.5</u> (1812)/CoFeB1.5 (1813)/Capping layers (1814)/Top electrode (1815),
where unbracked numbers are thickness in nanometer scale, the PGGP seed layers are indicated by underline, and the bi-layered pinned layers are indicated in bold font.

Referring to FIG. 18, one of important aspect of the seventh embodiment is the insertion of the preferred grain growth promotion seed layer, which is the second crystalline CoFe ferromagnetic reference layer 1805 and/or the first crystalline CoFe ferromagnetic free layer 1812, under or sandwiching the MgO tunnel barrier (1809, 1810, 1811). Another important aspect of the seventh embodiment is the employment of the bi-layer-structured ferromagnetic pinned layer, in that the first amorphous CoFeB ferromagnetic pinned layer 1804 on the antiferromagnetic PtMn pinning layer 1803 and the second crystalline CoFe ferromagnetic pinned layer 1805 on the first amorphous CoFeB ferromagnetic pinned layer 1804 are deposited with the thickness of 1.25 nm and 1.25 nm, respectively.

The first amorphous Co(60 at. %)Fe(20 at. %)B(20 at. %) ferromagnetic reference layer 1807 with thickness of 1.5 nm is deposited on the non-magnetic Ru spacer layer 1806. The second crystalline ferromagnetic Co(70 at. %)Fe(30 at. %) reference layer, which is the preferred grain growth promotion seed layer, is deposited with thickness of 1.5 nm on the first amorphous ferromagnetic reference layer 1807.

The method of forming the MgO tunnel barrier is as follows;
deposition of first metallic Mg layer 1809 on the second crystalline ferromagnetic reference layer 1808, which is the preferred grain growth promotion seed layer, with thickness of 0.7 nm,
oxidation of the first metallic layer 1809 by natural oxidation carried out in the oxidation chamber. The natural oxidation process, which is advantageously applied to the thinly formed metallic Mg layer, requires purging the oxidation chamber with oxygen gas at a pressure of approximately $9.9 \times 10^{-2}$ Pa and flowing the oxygen gas at the flow rate of 100 sccm, then leaving the as-deposited metallic Mg layer in contact with the oxygen gas flow forgiven exposure time, and
deposition of the metallic Mg cap layer 1811 with thickness of 0.3 nm on the first metallic Mg layer 1810 oxidized by natural oxidation.

With reference to FIG. 18, the first crystalline ferromagnetic Co(70 at. %)Fe(30 at. %) free layer 1812, which is the preferred grain growth promotion seed layer, is deposited with thickness of 1.5 nm on the metallic Mg cap layer 1811. Then the second amorphous Co(60 at. %)Fe(20 at. %)B(20 at. %) ferromagnetic free layer 1813 with thickness of 1.5 nm is deposited on the first crystalline ferromagnetic free layer 1812.

Post-deposition magnetic field annealing is carried out at 380° C. for 2 hour under 10 kOe magnetic field. The purposed of post-deposition annealing is the crystallization of the first amorphous ferromagnetic reference layer 1807 and/or the second amorphous ferromagnetic free layer 1813 and the preferred grain growth of the amorphous or microcrystalline MgO tunnel barrier with poor (001) out-of-plane texture. This crystallization and the preferred grain growth are realized using the second crystalline CoFe ferromagnetic reference layer 1805 and/or the first crystalline CoFe ferromagnetic free layer 1812 as adjacent crystallization or preferred grain growth seed layer during annealing, thus eventually overall (001) out-of-plane texture of the ferromagnetic reference layer, MgO tunnel barrier and the ferromagnetic free layer.

Figure 19:
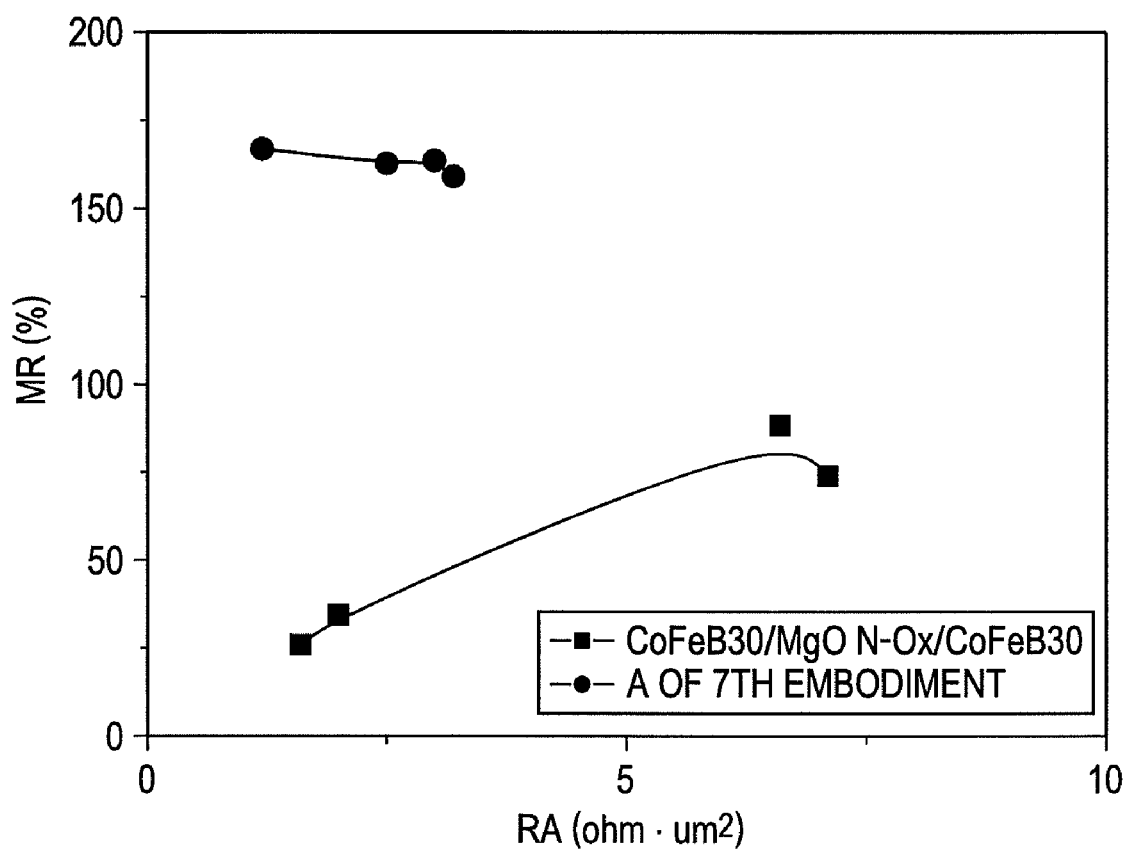
FIG. 19 shows the magnetotransport property comparison of A MTJ stack of the seventh embodiment of the present invention compared to that of MTJ with MgO prepared by natural oxidation without PGGP seed layer.

With reference to FIG. 19, the magnetotransport properties of the MTJ prepared by the method of the present invention were measured using CIPT method. In order for comparison, the MTJ with the structure of "Bottom layers/PtMn15/CoFe2.5/Ru0.9/CoFeB3/Mg1.1/N—Ox seconds/Mg0.3/CoFeB3/Capping layers", in which crystalline CoFe PGGP seed layer is not employed and the ferromagnetic pinned layer is CoFeB single layer, is shown as reference (marked ■). Also the reference MTJ is annealed at 360° C. for 2 hours under 10 kOe magnetic field. As shown in FIG. 19, with reference to the MR ratio and R×A product obtained from the MTJ with MgO prepared by same oxidation method but without the insertion of the crystalline PGGP seed layer, it is apparent that the MTJ which employs the crystalline PGGP layer shows much improved magnetotranport properties, in that noticeable increase of MR ratio is obtained with significant reduction of R×A product. At given R×A product of about 1.5 $\Omega\mu m^2$, MTJ with MgO prepared by natural oxidation without the crystalline PGGP seed layer provides MR ratio of 25.8%, whereas the MTJ with MgO deposited by natural oxidation with the crystalline CoFe PGGP seed layer, A stack, provides 168.8%.

Again, based on the previous studies correlating magnetotransport property and the crystallinity and pseudo-epitaxy in MTJ, it can be intuitively inferred that the insertion of the crystalline CoFe PGGP seed layer adjacent the MgO tunnel barrier, which is amorphous or microcrystalline with poor (001) out-of-plane texture, induces the crystallization and the preferred grain growth of the MgO tunnel barrier during the post-deposition annealing.

Figure 24:
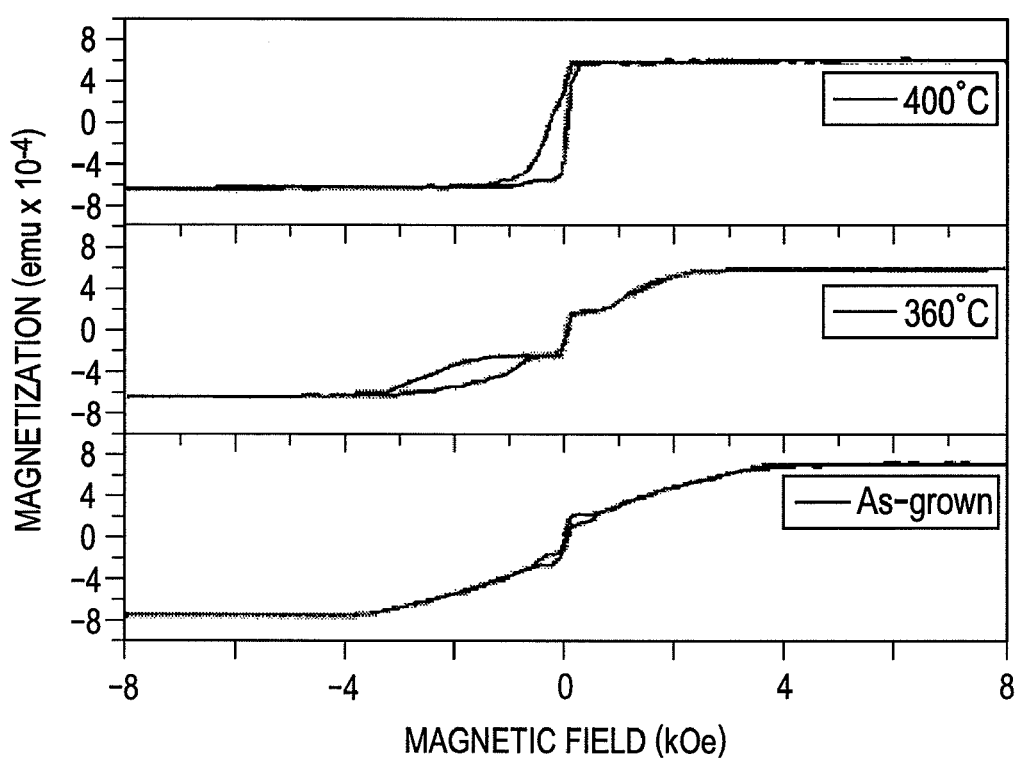
FIG. 24 shows the evolution of hysteresis loop of 'No PGGP magnetic tunnel junction at annealing temperatures of 400° C., 300° C. and "as grown".
Figure 25A:
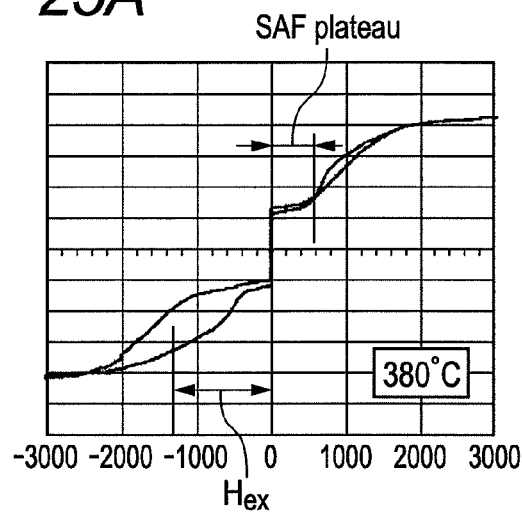
FIG. 25A to FIG. 25C shows the evolution of hysteresis loop of 'PGGP & bi-PL' magnetic tunnel junction at annealing temperatures of 380° C., 400° C. and 420° C.
Figure 25B:
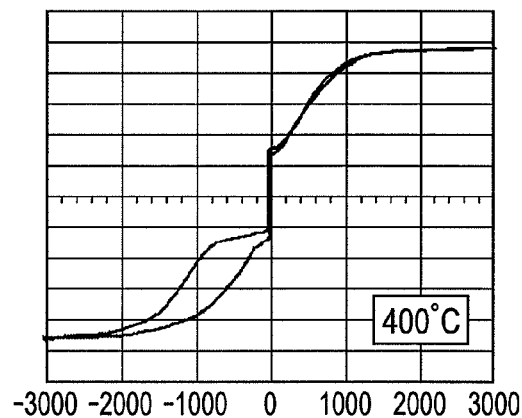
Figure 25C:
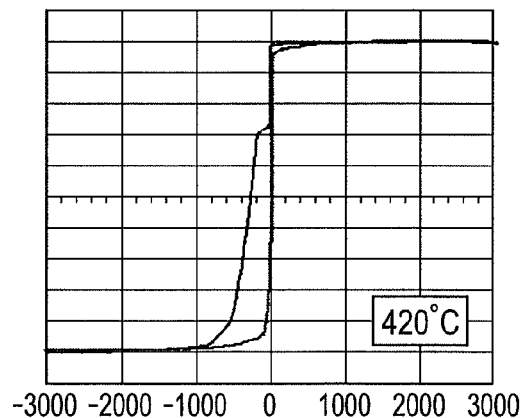

With reference to FIG. 23A to FIG. 23F, FIG. 24 and FIG. 25A to FIG. 25C, it is clear that the magnetic tunnel junction with bi-layered ferromagnetic pinned layer as illustrated in FIG. 18 shows better thermal stability than the magnetic tunnel junction with single ferromagnetic pinned layer. FIG. 23A to FIG. 23F show the comparison of TMR, RA and Hex of magnetic tunnel junctions with different stack structure. 'No PGGP' indicates the magnetic tunnel junction without PGGP seed layer and bi-layered ferromagnetic pinned layer. 'PGGP only' indicates the magnetic tunnel junction only with PGGP seed layer but no bi-layered ferromagnetic pinned layer. 'PGGP & bi-PL' indicates the magnetic tunnel junction with both of PGGP seed layer and bi-layered ferromagnetic pinned layer. Bi-layered ferromagnetic pinned layer is described above as Group41. TMR of 'No PGGP' magnetic tunnel junction drops significantly at the temperature of 400° C., whereas that of 'PGGP only' and 'PGGP & bi-PL' magnetic tunnel junctions sustains up to 400° C. However, exchange-biasing (Hex) of both of 'No PGGP' and 'PGGP only' magnetic tunnel junctions shows noticeable drop from 380° C. annealing and down to 500 Oe at 400° C. annealing, however, that of 'PGGP & bi-PL' magnetic tunnel junction at 400° C. is as high as 1500 Oe, which shows strong thermal stability. Shape of hysteresis loops shows clear difference in FIG. 24 and FIG. 25A to FIG. 25C. FIG. 24 shows the evolution of hysteresis loop of 'No PGGP' magnetic tunnel junction at annealing temperatures of 400° C., 360° C. and "as grown" and FIG. 25A to FIG. 25C show the evolution of hysteresis loop of 'PGGP & bi-PL' magnetic tunnel junction at annealing temperatures of 380° C., 400° C. and 420° C. It is clear that 'No PGGP' magnetic tunnel junction looses exchange-biasing (Hex) and SAF plateau at 400° C., whereas 'PGGP & bi-PL' magnetic tunnel junction sustains Hex and SAF plateau at 400° C.

Figure 26:
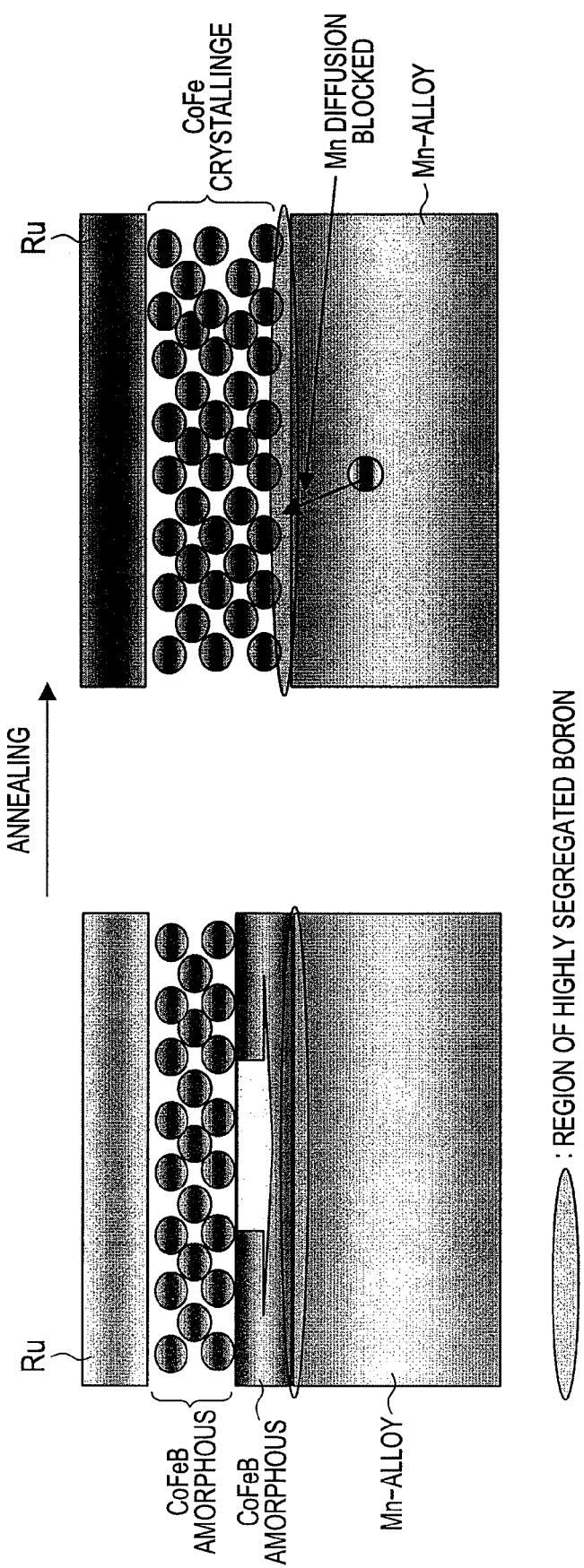
FIG. 26 schematically shows enhanced thermal stability.

This enhanced thermal stability of magnetic tunnel junction with 'bi-PL' can be explained by the boron segregation blocking manganese (Mn) diffusion from antiferromagnetic Mn-alloy. FIG. 26 shows the schematic explanation of enhanced thermal stability. During annealing, boron in CoFeB pinned layer diffuses out while CoFeB crystallizes based on CoFe pinned layer as crystallization template and segregates at the CoFeB/Mn-alloy interface. As Mn diffusion has been reported to be responsible for the reduction of Hex, Mn diffusion barrier, which is boron segregated at the interface, is attributed to achieving the better thermal stability. This thermal stability of magnetic tunnel junction enlarges the process window for MRAM production as it includes high temperature CMOS process.

The present invention includes an embodiment wherein only a ferromagnetic pinned layer deposition step comprises a crystalline ferromagnetic pinned layer formation step and an amorphous ferromagnetic pinned layer formation step. And the crystalline ferromagnetic pinned layer is nearer to a non-magnetic spacer layer than the amorphous ferromagnetic pinned layer.

The invention claimed is:

1. A method of manufacturing a magnetic tunnel junction device, the method comprising:
    a first amorphous ferromagnetic pinned layer deposition step of depositing a first amorphous ferromagnetic pinned layer;
    a second crystalline ferromagnetic pinned layer deposition step of depositing a second crystalline ferromagnetic pinned layer onto the first amorphous ferromagnetic pinned layer;
    a non-magnetic spacer layer deposition step of depositing a non-magnetic spacer layer onto the second crystalline ferromagnetic pinned layer;
    a first layer deposition step of depositing a first layer which contains ferromagnetic material onto the non-magnetic spacer layer;
    a tunnel barrier layer deposition step of depositing a tunnel barrier layer onto the first layer; and
    a second layer deposition step of depositing a second layer which contains ferromagnetic material onto the tunnel barrier layer,
    wherein the first layer deposition step comprises:
    a first amorphous ferromagnetic layer formation step of forming a first amorphous ferromagnetic layer, and
    a second crystalline ferromagnetic layer formation step of forming a second crystalline ferromagnetic layer, which is the preferred grain growth promotion (PGGP) seed layer, sandwiched by the first amorphous ferromagnetic layer and the tunnel barrier layer.

2. The method according to claim 1, wherein the second crystalline ferromagnetic pinned layer is formed using at least one of Co, Ni, Fe and B.

3. The method according to claim 1, wherein the first amorphous ferromagnetic pinned layer is ternary alloy containing Co, Fe and B.

4. The method according to claim 1, wherein the first amorphous ferromagnetic pinned layer is formed with a thickness between 0.5 nm and 2 nm.

5. The method according to claim 1, wherein the second crystalline ferromagnetic pinned layer is formed with a thickness between 1 nm and 4 nm.

6. A method of manufacturing a magnetic tunnel junction device, the method comprising:
    a free layer deposition step of depositing a free layer which contains ferromagnetic material;
    a reference layer deposition step of depositing a reference layer which contains ferromagnetic material;
    a tunnel barrier layer deposition step of depositing a tunnel barrier layer between the free layer and reference layer;
    a non-magnetic spacer layer depositing step of depositing a non-magnetic spacer layer which contacts the reference layer; and
    a ferromagnetic pinned layer deposition step of depositing a ferromagnetic pinned layer which contacts the non-magnetic spacer layer,
    wherein the ferromagnetic pinned layer deposition step comprises:
    a crystalline ferromagnetic pinned layer formation step of forming a crystalline ferromagnetic pinned layer which contacts the non-magnetic spacer layer, and
    an amorphous ferromagnetic pinned layer formation step of forming an amorphous ferromagnetic pinned layer which contacts the crystalline ferromagnetic pinned layer.

* * * * *